(12) United States Patent
Ishii

(10) Patent No.: US 11,405,049 B2
(45) Date of Patent: Aug. 2, 2022

(54) OPTICAL COMMUNICATION APPARATUS AND CORRECTING METHOD

(71) Applicant: Fujitsu Optical Components Limited, Kawasaki (JP)

(72) Inventor: Toshio Ishii, Yokohama (JP)

(73) Assignee: FUJITSU OPTICAL COMPONENTS LIMITED, Kawaskai (JP)

( * ) Notice: Subject to any disclaimer, the term of this patent is extended or adjusted under 35 U.S.C. 154(b) by 0 days.

(21) Appl. No.: 17/163,900

(22) Filed: Feb. 1, 2021

(65) Prior Publication Data

US 2021/0266009 A1 Aug. 26, 2021

(30) Foreign Application Priority Data

Feb. 21, 2020 (JP) .............................. JP2020-028851

(51) Int. Cl.
*H03M 3/00* (2006.01)
*H03M 1/74* (2006.01)
*H03H 17/06* (2006.01)

(52) U.S. Cl.
CPC ........ *H03M 3/504* (2013.01); *H03H 17/0614* (2013.01); *H03M 1/74* (2013.01)

(58) Field of Classification Search
CPC .... H03M 3/504; H03M 1/74; H03M 17/0614; H03M 17/06; H03M 17/0295; H03M 17/0294
See application file for complete search history.

(56) References Cited

U.S. PATENT DOCUMENTS

2010/0142956 A1\* 6/2010 Larikova ................. H04J 14/02
398/79

FOREIGN PATENT DOCUMENTS

JP 2019-125826 7/2019

\* cited by examiner

*Primary Examiner* — Lam T Mai
(74) *Attorney, Agent, or Firm* — Staas & Halsey LLP

(57) ABSTRACT

An optical communication apparatus includes a level detector, an FIR filter, and a adjustor. The level detector detects level information that discriminates a change in a multi-value level based on an input signal used in a multi-value amplitude modulation system. The FIR filter compensates a signal band of the input signal in accordance with tap coefficients of a plurality of multipliers. The adjustor corrects the tap coefficient of each of the multipliers included in the FIR filter based on the level information detected in the level detector.

9 Claims, 27 Drawing Sheets

FIG.12

| SECOND DISCRIMINATOR OUTPUT | FIRST DISCRIMINATOR OUTPUT | S1 (OR CIRCUIT OUTPUT) | S2 (NOR CIRCUIT OUTPUT) |
|---|---|---|---|
| L | L | L | H |
| L | H | H | L |
| H | L | H | L |
| H | H | H | L |

FIG.25
| | COMPARATIVE EXAMPLE 3 | SEVENTH EMBODIMENT |
|---|---|---|
| DML INPUT | 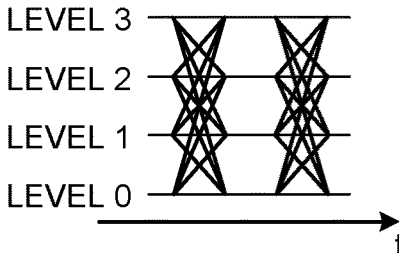 | 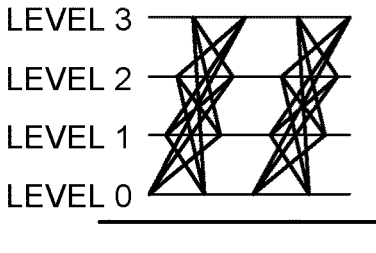 |
| DML OUTPUT | 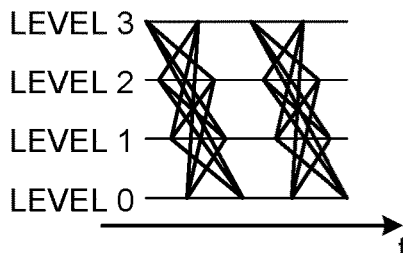 | 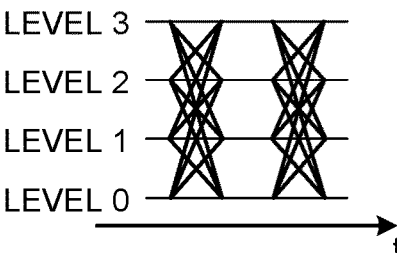 |
FIG.26
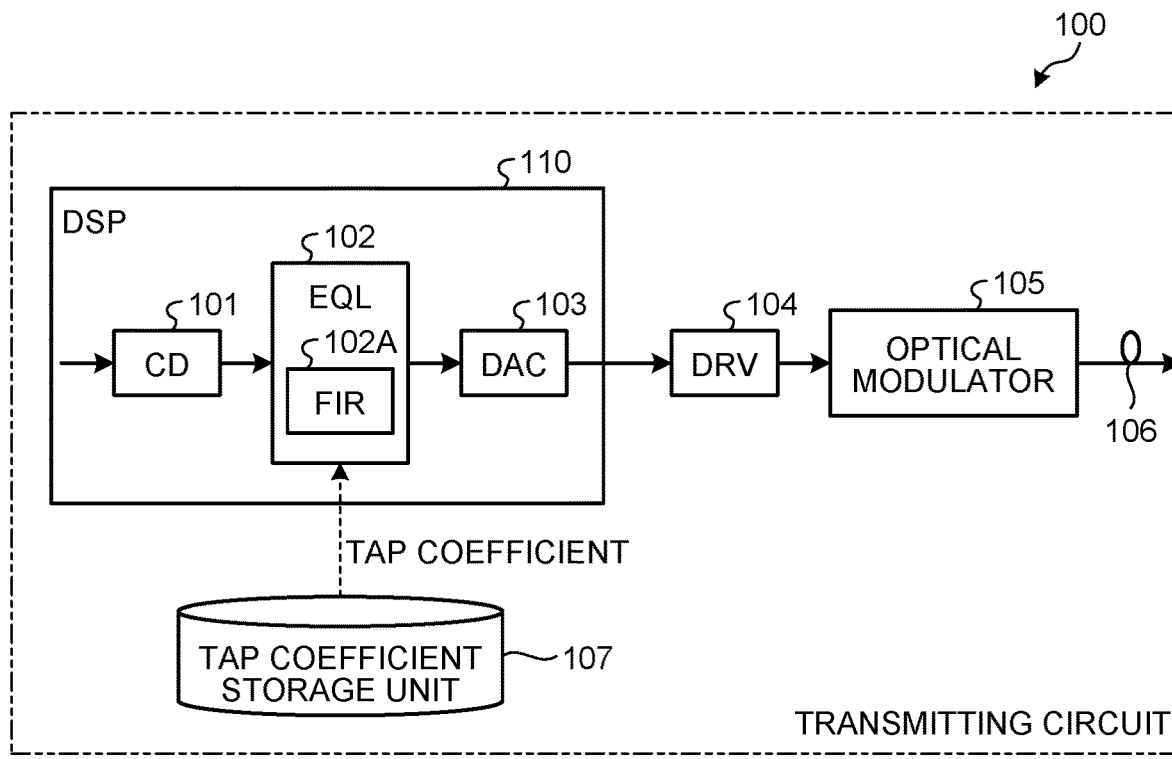

US 11,405,049 B2

OPTICAL COMMUNICATION APPARATUS AND CORRECTING METHOD

CROSS-REFERENCE TO RELATED APPLICATION

This application is based upon and claims the benefit of priority of the prior Japanese Patent Application No. 2020-028851, filed on Feb. 21, 2020, the entire contents of which are incorporated herein by reference.

FIELD

The embodiments discussed herein are related to an optical communication apparatus and a correcting method.

BACKGROUND

In optical communication apparatuses, in order to compensate signal bands of input signals, digital filters, such as finite impulse response (FIR) filters, are widely used. Furthermore, in recent years, in optical communication apparatuses, in order to transmit large volumes of data at a same transmission speed, multiple valued, for example, a 4-level pulse amplitude modulation (PAM4) signaling system is used.

FIG. 26 is a block diagram illustrating an example of a transmitting circuit 100 according to a comparative example 1. The transmitting circuit 100 according to the comparative example 1 illustrated in FIG. 26 includes a digital signal processor (DSP) 110, a driver (DRV) 104, an optical modulator 105, an optical fiber 106, and a tap coefficient storage unit 107. The DSP 110 includes a coder (CD) 101, an equalizer (EQL) 102, and a digital-to-analogue convertor (DAC) 103. The CD 101 converts, for example, a non-return-to-zero (NRZ) electrical signal to a PAM4 electrical signal. The EQL 102 compensates the signal band of the PAM4 electrical signal by using an FIR filter 102A. The DAC 103 performs analog conversion on the PAM4 electrical signal that has been subjected to band compensation. The DRV 104 outputs a driving signal to the optical modulator 105 in accordance with the PAM4 electrical signal that has been subjected to analog conversion. The optical modulator 105 performs optical modulation on the PAM4 electrical signal in accordance with the driving signal and outputs the PAM4 optical signal that has been subjected to optical modulation to the optical fiber 106.

The tap coefficient storage unit 107 stores therein tap coefficients of the corresponding multipliers included in the FIR filter 102A in the EQL 102. The EQL 102 sets, at the time of activation, a tap coefficient of each of the multipliers that is being stored in the tap coefficient storage unit 107 into each of the multipliers in the FIR filter 102A. The FIR filter 102A can adjust an emphasis ratio of the signal band by changing the tap coefficient of each of the multipliers.

FIG. 27 is a diagram illustrating an example of the output characteristic for each unit included in the transmitting circuit 100. The output characteristic of the EQL 102 has a characteristic of compensating a signal band of an input signal by adjusting a gain for each frequency of the input signal, for example, an emphasis ratio. For example, the output characteristics of the transmission devices, such as the DAC 103, the DRV 104, and the optical modulator 105 each have a static characteristic in which an input signal and an output signal are in proportion to each other and a frequency band characteristic in which a gain for each frequency of an input signal varies.

FIG. 28 is a diagram illustrating an example of an output signal for each unit in a case in which the static characteristic of the transmission device in the transmitting circuit 100 is linear. The PAM4 signal is a signal used in a multi-value amplitude modulation system that has signal levels having, for example, four stages, such as signal levels 0 to 3. FIG. 28 illustrates an output signal of the EQL 102; an output signal of the static characteristic of each of the transmission devices, such as the DAC 103, the DRV 104, and the optical modulator 105; and an output signal of the frequency band characteristic of the transmission devices.

When the static characteristic of the transmission devices is linear, the EQL 102 compensates the signal band of the PAM4 electrical signal by using the FIR filter 102A, whereby the EQL 102 can sufficiently compensate the signal band of the output signal of each of the transmission devices, such as the DAC 103, the DRV 104, and the optical modulator 105.

The FIR filter 102A included in the transmitting circuit 100 according to the comparative example 1 sets, at the time of activation, the tap coefficients that are being stored in the tap coefficient storage unit 107 to the corresponding multipliers in the FIR filter 102A. However, the FIR filter 102A compensates, as illustrated in FIG. 29, the signal band of each of the signal levels at a constant emphasis ratio without depending on the signal level of the input PAM4 electrical signal. Furthermore, the emphasis ratio is a ratio of, for example, the signal amplitude to emphasis peaking of an electrical signal. The constant emphasis ratio means that the emphasis ratio for each signal level of the PAM4 electrical signal is the same ratio.

Patent Document 1: Japanese Laid-open Patent Publication No. 2019-125826

FIG. 30 is a diagram illustrating an example of an output signal for each unit in a case in which the static characteristic of the transmission device included in the transmitting circuit 100 is nonlinear. In the transmitting circuit 100, when the static characteristic of the transmission device is nonlinear, even when the signal band is compensated by a constant emphasis ratio by using the FIR filter 102A, the signal levels of the static characteristic and the frequency band characteristic of the transmission device varies in accordance with the nonlinear characteristic. Namely, the static characteristic of the transmission device is in a state in which, for example, the signals at the signal levels 0 and 3 is small, whereas the frequency characteristic of the transmission device is in a state in which, for example, compensation of the signals at the signal levels 0 and 3 is insufficient.

However, in the transmitting circuit 100, because the emphasis ratio of the signal for each signal level is constant, it is not possible to change the emphasis ratio of the signal for each signal level in accordance with the nonlinear characteristic. Thus, in the transmitting circuit 100, because it is not possible to ensure optimum signal compensation for each signal level, it is not possible to ensure an optimum eye opening for each signal level. Accordingly, in order to ensure an optimum eye opening for each signal level, there is a demand for a FIR filter that can change the emphasis ratio of signals in accordance with a change in the signal level.

SUMMARY

According to an aspect of an embodiment, an optical communication apparatus includes a level detector, a FIR filter and an adjustor. The level detector detects level information that discriminates a change in a multi-value level based on an input signal used in a multi-value amplitude modulation system. The FIR filter compensates a signal band of the input signal in accordance with tap coefficients of a plurality of multipliers. The adjustor corrects, based on the level information detected in the level detector, the tap coefficient of each of the multipliers included in the FIR filter.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 12 is a diagram illustrating a truth value table of an OR circuit and an AND circuit in the third FIR filter according to the third embodiment;

FIG. 25 is a diagram illustrating an example of a DML input signal and a DML output signal according to the comparative example 3 and the seventh embodiment;

FIG. 26 is a block diagram illustrating an example of a transmitting circuit according to the comparative example 1;

DESCRIPTION OF EMBODIMENTS

Preferred embodiments of the present invention will be explained with reference to accompanying drawings. The present invention is not limited to the embodiments. Furthermore, the embodiments described below may also be used in any appropriate combination as long as the embodiments do not conflict with each other.

[a] First Embodiment

Figure 1:
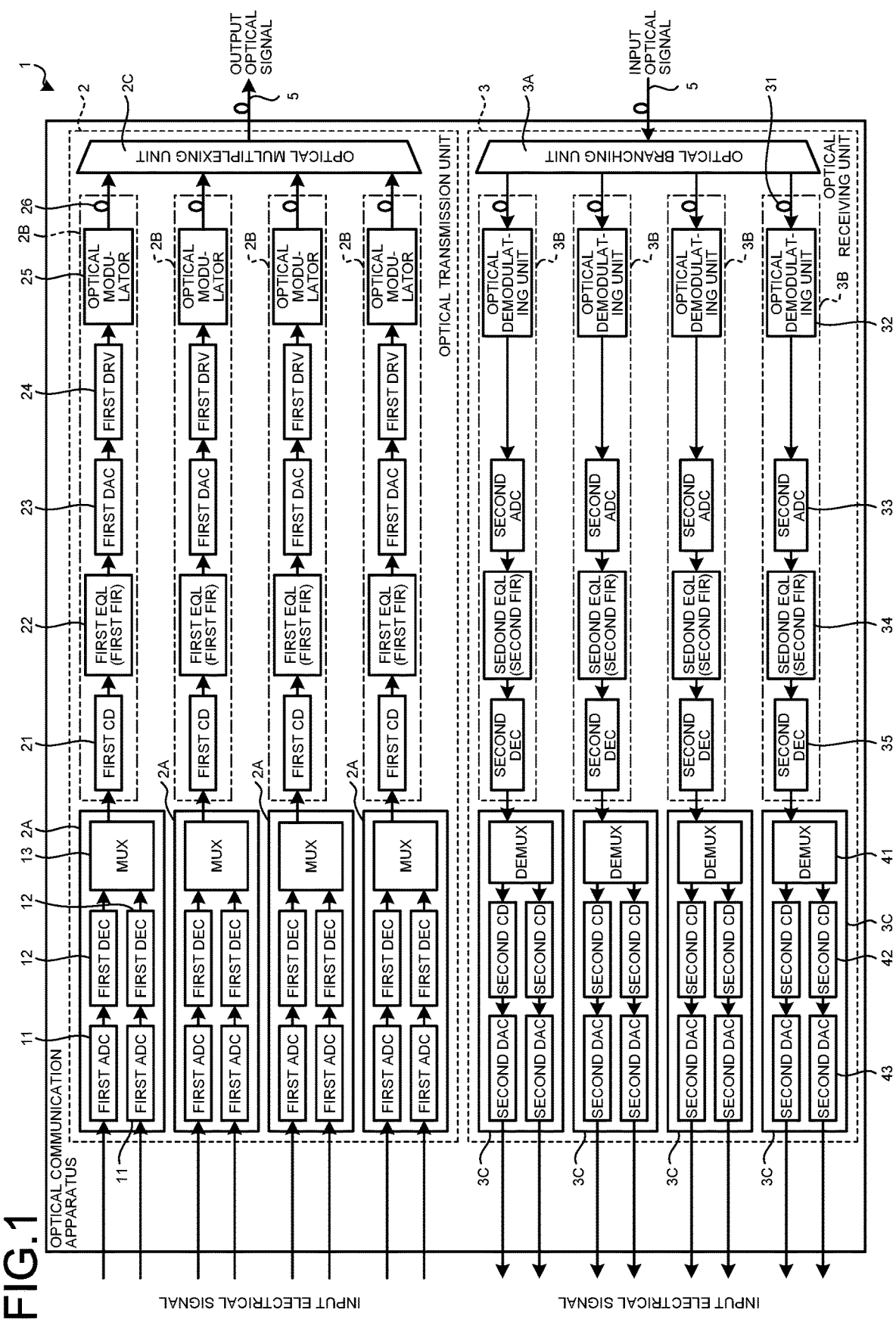
FIG. 1 is a block diagram illustrating an example of an optical communication apparatus according to an embodiment.

FIG. 1 is a block diagram illustrating an example of an optical communication apparatus 1 according to an embodiment. The optical communication apparatus 1 illustrated in FIG. 1 includes an optical transmission unit 2 and an optical receiving unit 3. The optical transmission unit 2 includes four input interfaces 2A, four transmitting circuits 2B, and a single optical multiplexing unit 2C. Each of the input interfaces 2A includes two first analogue-to-digital convertors (ADCs) 11, two first decoder (DECs) 12, and a single multiplexer (MUX) 13. Each of the first ADCs 11 performs digital conversion on an input PAM4 electrical signal and then outputs the PAM4 electrical signal that has been subjected to digital conversion to the first corresponding DECs 12. Each of the first DECs 12 converts the PAM4 electrical signal to non-return-to-zero (NRZ) electrical signal and then outputs the NRZ electrical signal to the MUX 13. The MUX 13 multiplexes the NRZ electrical signal in each of the first DECs 12 and outputs the multiplexed NRZ electrical signal to the transmitting circuit 2B.

Figure 2:
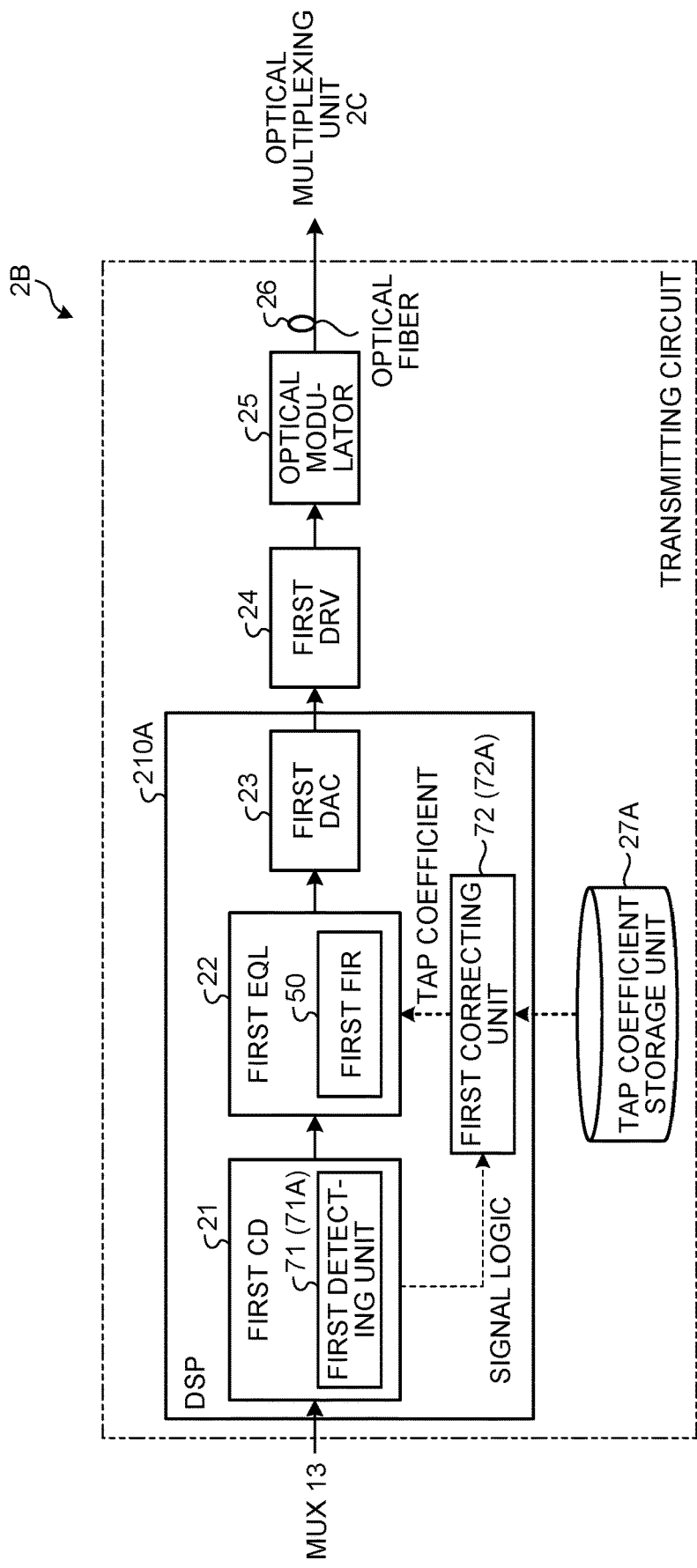
FIG. 2 is a block diagram illustrating an example of a transmitting circuit according to a first embodiment.

FIG. 2 is a block diagram illustrating an example of the transmitting circuit 2B according to the first embodiment. The transmitting circuit 2B illustrated in FIG. 2 includes a digital signal processor (DSP) 210, a first driver (DRV) 24, an optical modulator 25, and an optical fiber 26. The DSP 210 converts the NRZ electrical signal to the PAM4 electrical signal. The first DRV 24 outputs a driving signal to the optical modulator 25 in accordance with the PAM4 electrical signal. The optical modulator 25 includes a laser diode (LD) and a modulator that are not illustrated. The optical modulator 25 performs optical modulation on the PAM4 electrical signal in accordance with the driving signal and outputs the PAM4 optical signal that has been subjected to optical modulation to the optical multiplexing unit 2C. The optical multiplexing unit 2C multiplexes the PAM4 optical signals received from the four optical modulators 25 included in the corresponding the four transmitting circuits 2B and outputs the multiplexed PAM4 optical signal to a transmission fiber 5.

The DSP 210 includes a first coder (CD) 21, a first equalizer (EQL) 22, a first digital-to-analogue convertor (DAC) 23, a first correcting unit 72A (72) as an adjustor, and a tap coefficient storage unit 27A. The first CD 21 converts the NRZ electrical signal to the PAM4 electrical signal. The first CD 21 includes a first detecting unit 71A (71) as a level detector. The first detecting unit 71A detects, from the PAM4 electrical signal, a signal logic that indicates a change transition of the signal levels that are multi-value levels. The signal logic is level information indicating transition of a change in the level of, for example, PAM4, i.e., a change in the level of, for example, signal levels of 0→1, 0→2, 0→3, 3→0, 3→1, 3→2, and the like. The first EQL 22 includes, for example, a first finite impulse response (FIR) filter 50 that performs band compensation on the PAM4 electrical signal. The first DAC 23 performs analog conversion on the PAM4 electrical signal that has been subjected to band compensation in the first FIR filter 50 and then outputs the PAM4 electrical signal that has been subjected to analog conversion to the first DRV 24.

Furthermore, the optical receiving unit 3 includes a single optical branching unit 3A, four receiving circuits 3B, and four output interfaces 3C. The optical branching unit 3A branches the PAM4 optical signal into the four receiving circuits 3B. Each of the receiving circuits 3B includes an optical fiber 31, an optical demodulating unit 32, a second analogue-to-digital convertor (ADC) 33, a second EQL 34, and a second DEC 35. The optical demodulating unit 32 includes a photodetector (PD) and a preamplifier that are not illustrated. The PD performs electric conversion (demodulation) on the PAM4 optical signal received from the optical branching unit 3A and then outputs the PAM4 electrical signal that has been subjected to electric conversion to the preamplifier. The preamplifier amplifies the PAM4 electrical signal and outputs the amplified PAM4 electrical signal to the second ADC 33. The second ADC 33 performs digital conversion on the amplified PAM4 electrical signal and outputs the PAM4 electrical signal that has been subjected to digital conversion to the second EQL 34. The second EQL 34 is formed of a FIR filter, performs band compensation on the PAM4 electrical signal, and outputs the PAM4 electrical signal that has been subjected to band compensation to the second DEC 35. The second DEC 35 converts the PAM4 electrical signal that has been subjected to band compensation to a NRZ electrical signal and outputs the NRZ electrical signal to the output interface 3C.

The output interface 3C includes a single DEMUX 41, tow second CDs 42, and two second DACs 43. The DEMUX 41 splits the NRZ electrical signal received from the second DEC 35 and outputs the split NRZ electrical signal to each of the second CDs 42. The second CD 42 converts the NRZ electrical signal received from the DEMUX 41 to the PAM4 electrical signal and outputs the converted PAM4 electrical signal to the second DAC 43. The second DAC 43 performs analog conversion on the converted PAM4 electrical signal and outputs the PAM4 electrical signal that has been subjected to analog conversion.

Figure 3:
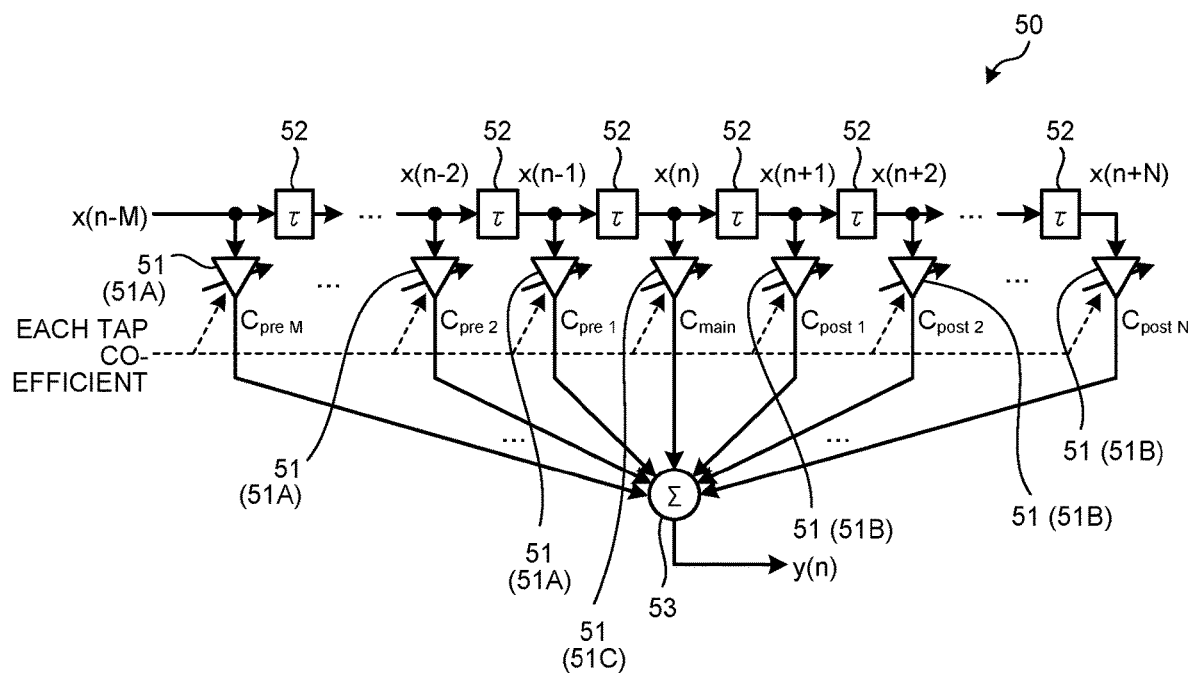
FIG. 3 is a block diagram illustrating an example of a first FIR filter according to the first embodiment.

In the following, the first FIR filter 50 included in the first EQL 22 in the transmitting circuit 2B will be described. FIG. 3 is a block diagram illustrating an example of the first FIR filter 50 according to the first embodiment. The first FIR filter 50 illustrated in FIG. 3 includes multipliers 51 having X taps, (X−1) pieces of delay devices 52, and an adder 53 that calculates the sum of the multiplication result obtained from X pieces of the multipliers 51. Regarding the multipliers 51 having X taps, a single piece of a main multiplier 51C, M pieces of multipliers 51A centered on the main multiplier 51C, and N pieces of multipliers 51B centered on the main multiplier 51C are arranged in parallel. The (X−1) pieces of the delay devices 52 are directly connected and delays an input signal by time τ. The outputs of (X−1) pieces of the delay devices 52 are respectively connected to an input of the $M^{th}$ to the $N^{th}$ multipliers 51 out of the multipliers 51 having X taps. The adder 53 generates the PAM4 electrical signal that has been subjected to band compensation by obtaining the sum of the multiplication results received from the corresponding multipliers 51. Each of the multipliers 51 multiplies the PAM4 electrical signal based on the set tap coefficient (gain). The tap coefficient storage unit 27A stores, in advance, the tap coefficient for each of the multipliers 51 included in the first FIR filter 50. Furthermore, the first correcting unit 72A sets, at the time of activation of the transmitting circuit 2B, the tap coefficients that are being stored in the tap coefficient storage unit 27A into the corresponding multipliers 51. The first correcting unit 72A corrects the tap coefficient of each of the multipliers 51 so as to compensate the nonlinear static characteristic of the transmission device in accordance with the signal logic of the PAM4 electrical signal detected in the first detecting unit 71A. Furthermore, the transmission device includes the first DAC 23, the first DRV 24, and the optical modulator 25.

Figure 4:
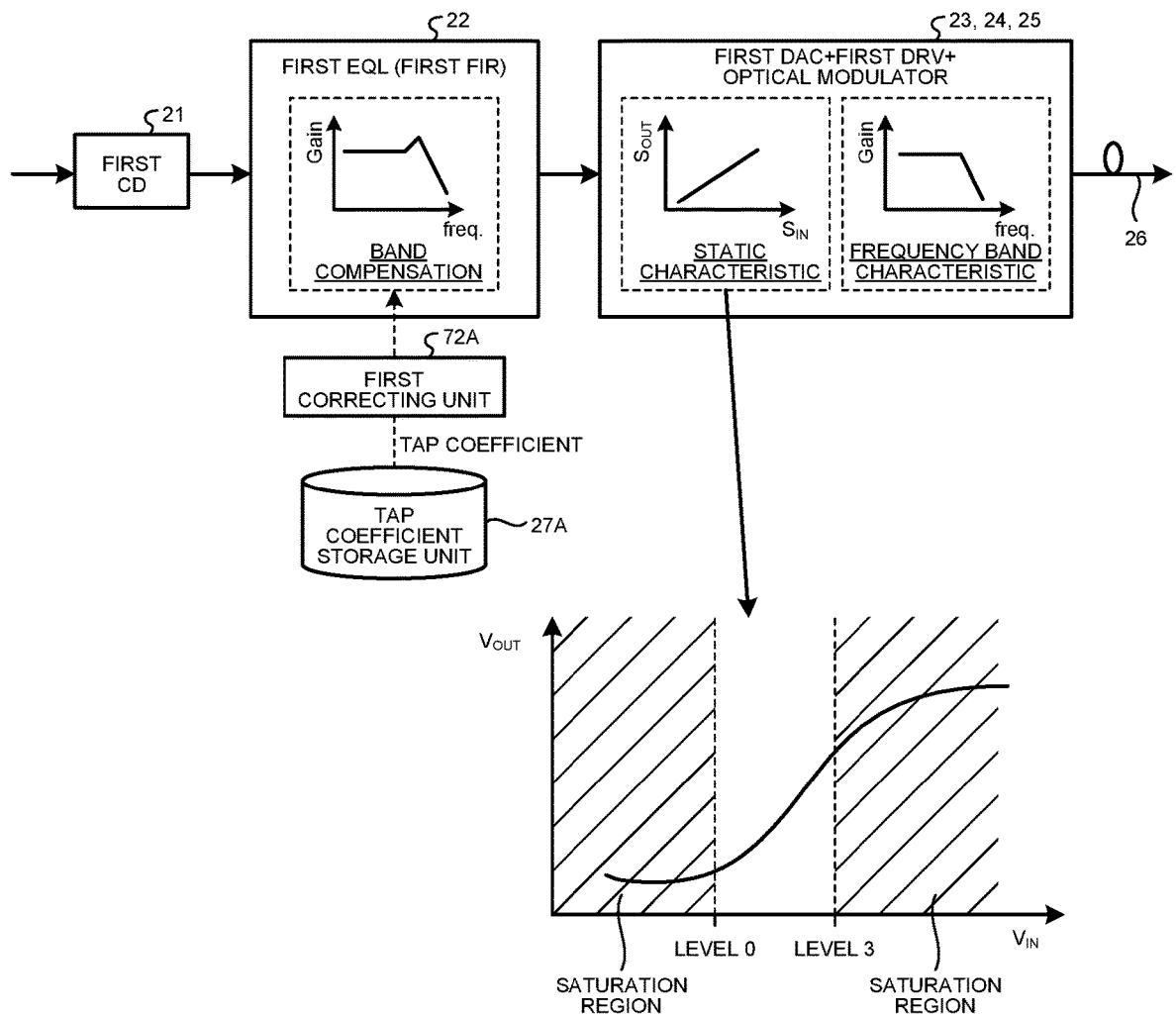
FIG. 4 is a diagram illustrating an example of an output characteristic for each unit included in the transmitting circuit.

FIG. 4 is a diagram illustrating an example of an output characteristic for each unit included in the transmitting circuit 2B. The output characteristic of the first EQL 22 has a characteristic of adjusting a gain (emphasis) for each frequency of an input signal and compensating the signal band of the input signal. The output characteristic of the transmission device has a static characteristic in which an input signal and an output signal are in proportion with each other and a frequency band characteristic in which the gain varies for each frequency of the input signal. Furthermore, it is assumed that the voltage of the output signal of the transmission device is linear at the signal levels 0 to 3 and it is assumed that a section that is less than the voltage corresponding to the signal level 0 and a section that is above the voltage corresponding to the signal level 3 are saturation regions. Namely, it can be said that voltage below the signal level 0 and the voltage above the signal level 3 are the voltage in which linearity of the static characteristic of the transmission device is saturated.

The first correcting unit 72A corrects the tap coefficient for each of the multipliers 51 included in the first FIR filter 50 in accordance with the signal logic detected in the first detecting unit 71A and sets the corrected tap coefficient into each of the multipliers 51. The first FIR filter 50 multiplies the PAM4 electrical signal by the corrected tap coefficient and can compensate the signal band of each of the PAM4 signal levels by emphasis ratios that are different at each of the signal levels depending on the multiplication result of each of the multipliers 51.

Figure 5:
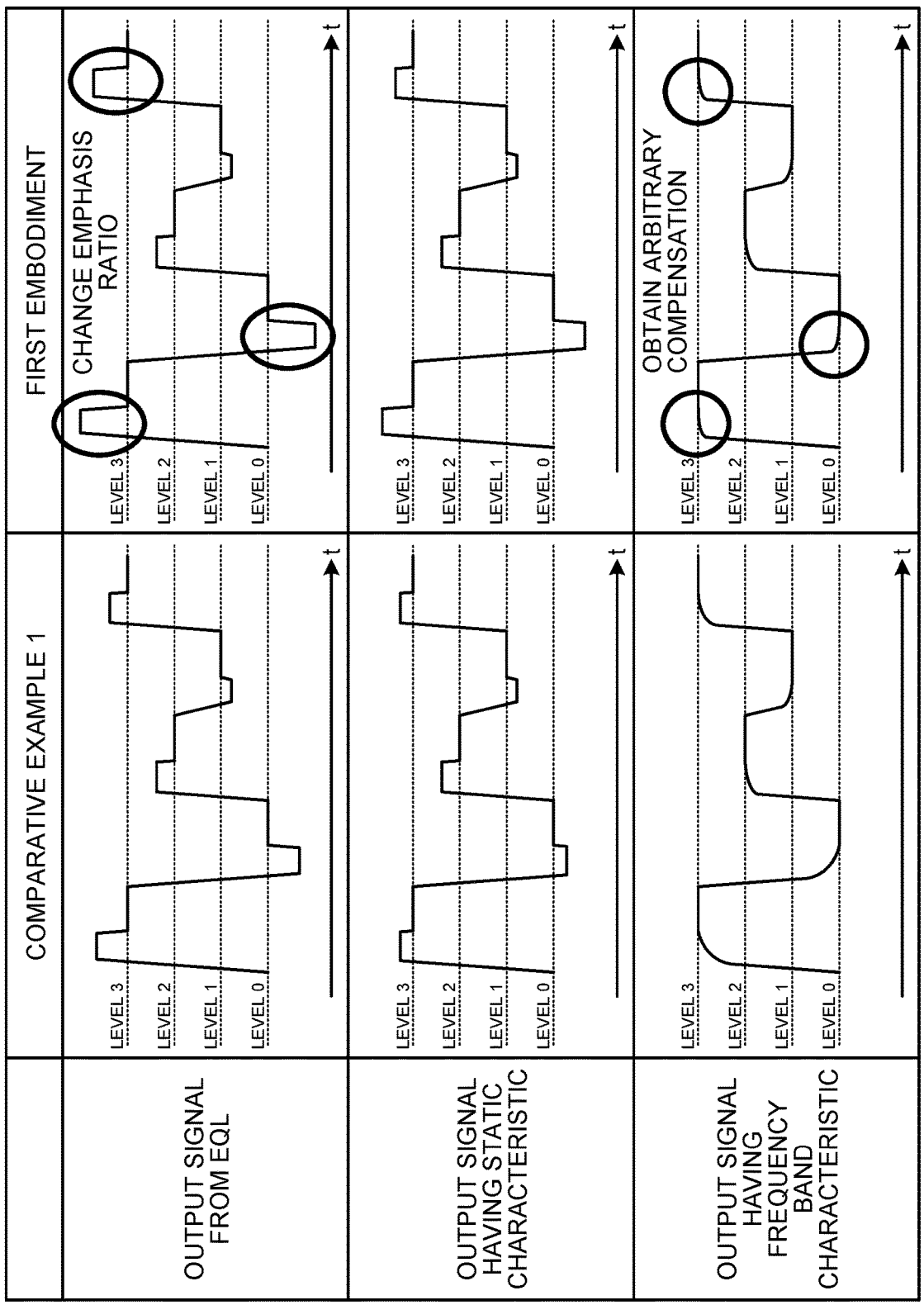
FIG. 5 is a diagram illustrating an example of output signals for each unit according to a comparative example 1 and the first embodiment in a case in which a static characteristic of a transmission device included in the transmitting circuit is nonlinear.

FIG. 5 is a diagram illustrating an example of output signals for each of the units according to the comparative example 1 and the first embodiment in a case in which the static characteristic of the transmission device included in the transmitting circuit 2B is nonlinear. Regarding the output signal of the EQL 102 in the transmitting circuit 100 according to the comparative example 1, the tap coefficient of each of the multipliers included in the FIR filter 102A is fixed; therefore, because the emphasis ratios for each of the signal levels are the same, an output of the signal level 0 or 3 is smaller than that of the signal level 1 or 2. Accordingly, regarding the output signal of the EQL 102, band compensation of the signals at the signal levels 0 and 3 are particularly insufficient. Consequently, regarding the output signal of the transmission device according to the comparative example 1, because the signal bands at the signal levels 0 and 3 are small, the output signal enters the state in which the PAM4 signal levels 0 to 3 are not discriminated on the reception side.

In contrast, even when the static characteristic of the transmission device is nonlinear, the transmitting circuit 2B according to the first embodiment corrects the tap coefficient for each of the multipliers 51 in the first FIR filter 50 so as to compensate the nonlinear static characteristic of the transmission device in accordance with the signal logic. The first FIR filter 50 compensates the signal bands for each of the signal levels by the emphasis ratios that are different for each signal levels. Consequently, regarding the output signal of the transmission device according to the first embodiment, even when the static characteristic of the transmission device is nonlinear, the nonlinear static characteristic is compensated by using the first FIR filter 50; therefore, the output signal enters the state in which the PAM4 signal levels 0 to 3 can be discriminated on the reception side.

The transmitting circuit 2B according to the first embodiment sets the tap coefficient associated with the emphasis ratio in accordance with the signal logic into each of the multipliers 51 included in the first FIR filter 50 so as to compensate the nonlinear static characteristic of the transmission device in accordance with the PAM4 signal logic. Namely, it is possible to apply an optimum emphasis ratio in accordance with a change in the signal level. Consequently, it is possible to compensate the signal band for each signal level.

Because the transmitting circuit 2B can apply an optimum emphasis ratio in accordance with a change in the signal level, it is possible to use nonlinear regions of the transmission device and it is thus possible to balance, for example, an extinction ratio, an improvement of optical modulation amplitude (OMA), and optimization of intersymbol interference.

Figure 6:
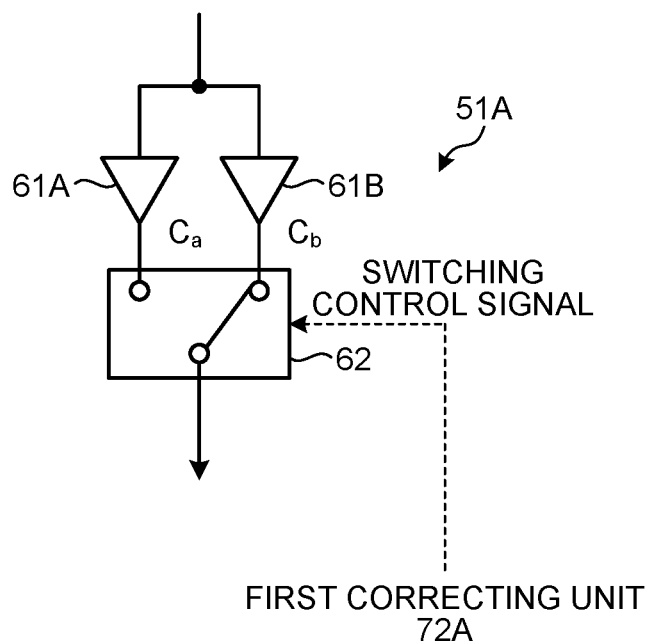
FIG. 6 is a diagram illustrating a modification of a multiplier included in the first FIR filter.

FIG. 6 is a diagram illustrating a modification of the multiplier 51 included in the first FIR filter 50. The multiplier 51A illustrated in FIG. 6 includes a first multiplier 61A, a second multiplier 61B, and a switching unit 62. The first multiplier 61A multiplies a PAM4 electrical signal by the first tap coefficient. The second multiplier 61B multiplies a PAM4 electrical signal by a second tap coefficient that is different from the first tap coefficient. The switching unit 62 can switch and output the first multiplier 61A or the second multiplier 61B in accordance with a switching control signal. The first correcting unit 72A outputs the switching control signal that controls the switching unit 62 in accordance with the signal logic. Furthermore, for convenience of description, a case in which two types of the multipliers 61A and 61B having different tap coefficients are switched is exemplified; however, the multipliers are not limited to the two types of multipliers having different tap coefficients. Three or more multipliers that have different tap coefficients and that can be switched may also be used and, furthermore, modifications are possible as needed.

Consequently, the first FIR filter 50 can change the emphasis ratio in accordance with the signal logic by switching the multipliers having different tap coefficients in accordance with the switching control signal associated with the signal logic.

Figure 7:
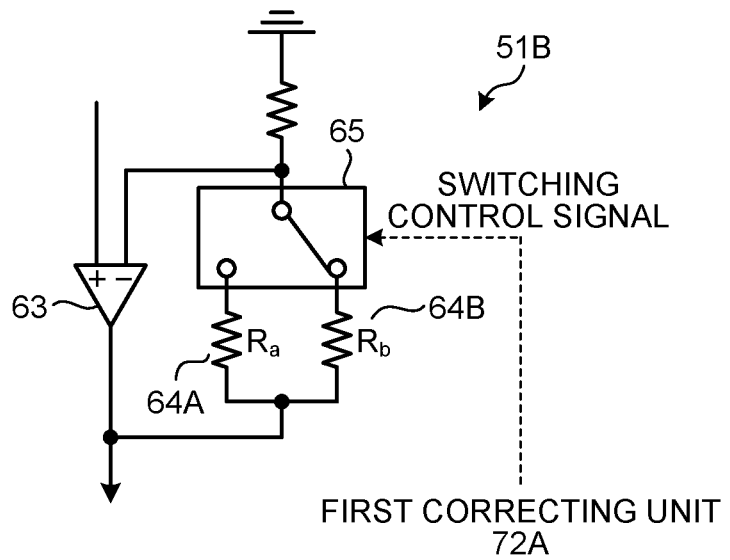
FIG. 7 is a diagram illustrating a modification of a multiplier included in the first FIR filter.

FIG. 7 is a diagram illustrating a modification of the multiplier 51 included in the first FIR filter 50. The multiplier 51B illustrated in FIG. 7 includes an operational amplifier 63, a first resistance 64A, a second resistance 64B, and a switching unit 65. The switching unit 65 switches and connects the first resistance 64A or the second resistance 64B to the operational amplifier 63. The first correcting unit 72A outputs, to the switching unit 65 in accordance with the signal logic, the switching control signal that is used to switch and connect the first resistance 64A or the second resistance 64B to the operational amplifier 63. The operational amplifier 63 is connected to the first resistance 64A via the switching unit 65, thereby functioning as a multiplier for the first tap coefficient, and is connected to the second resistance 64B via the switching unit 65, thereby functioning as a multiplier for the second tap coefficient. Furthermore, for convenience of description, a case in which two types of tap coefficients are switched is exemplified; however, the tap coefficients are not limited to two types. Three or more types of tap coefficients may also be used in a switchable manner and, furthermore, modifications are possible as needed.

Consequently, the first FIR filter 50 can change the emphasis ratio in accordance with the signal logic by switching different tap coefficients in accordance with the switching control signal associated with the signal logic.

Furthermore, regarding the first correcting unit 72A included in the transmitting circuit 2B according to the first embodiment, a case in which the tap coefficient of each of the multipliers 51 included in the first FIR filter 50 is corrected in accordance with the level change (signal logic) detected by the first detecting unit 71A is exemplified. However, the embodiment is not limited to this and modifications are possible as needed. For example, from among the signal levels 0 to 3, when reaching to each of the signal level has been detected, the correcting unit 72 may also correct the tap coefficient of each of the multipliers 51 in the first FIR filter 50 and the embodiment thereof will be described below as a second embodiment. Furthermore, by assigning the same reference numerals to components having the same configuration as those in the transmitting circuit 2B according to the first embodiment, overlapped descriptions of the configuration and the operation thereof will be omitted.

[b] Second Embodiment

Figure 8:
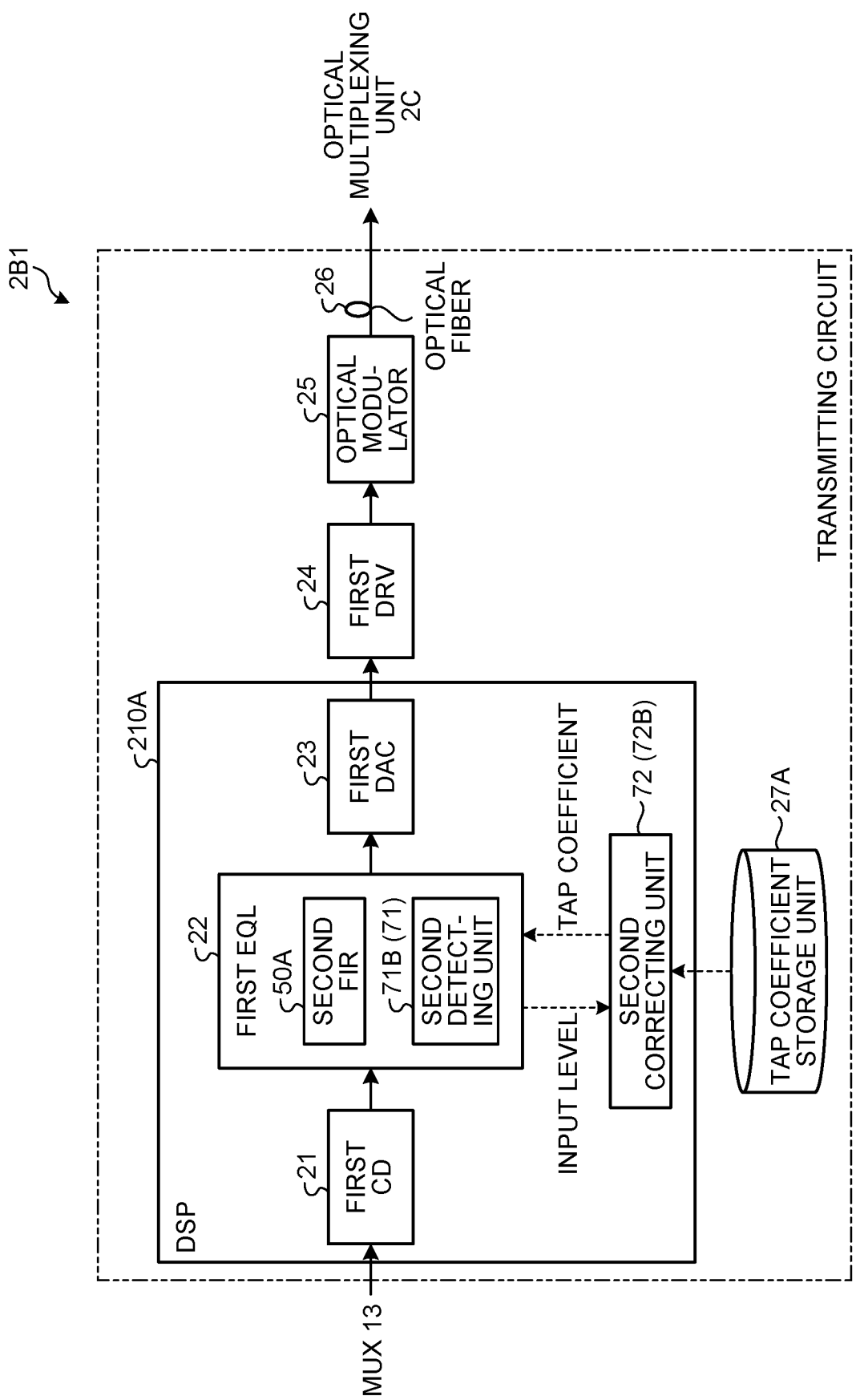
FIG. 8 is a block diagram illustrating an example of a transmitting circuit according to a second embodiment.
Figure 9:
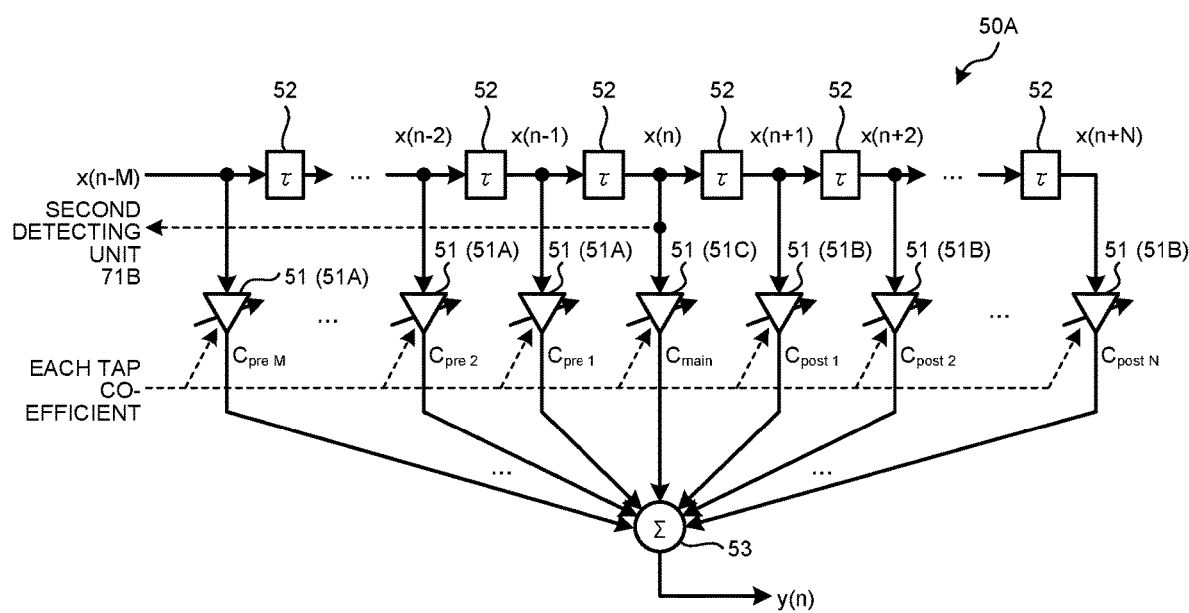
FIG. 9 is a block diagram illustrating an example of a second FIR filter according to the second embodiment.

FIG. 8 is a block diagram illustrating an example of a transmitting circuit 2B1 according to the second embodiment, and FIG. 9 is a block diagram illustrating an example of a second FIR filter 50A according to the second embodiment. Furthermore, by assigning the same reference numerals to components having the same configuration as those in the transmitting circuit 2B according to the first embodiment, overlapped descriptions of the configuration and the operation thereof will be omitted. The transmitting circuit 2B1 according to the second embodiment arranges, from among the signal levels of the PAM4 electrical signal, a second detecting unit 71B that detects reaching to each of the signal levels in the first EQL 22. The second detecting unit 71B detects reaching to each of the signal levels from the PAM4 electrical signal at the input stage of the main multiplier 51C included in the second FIR filter 50A illustrated in FIG. 9.

When reaching to the signal level is detected in the second detecting unit 71B, a second correcting unit 72B corrects the tap coefficient of each of the multipliers 51 included in the second FIR filter 50A so as to compensate the nonlinear static characteristic of, for example, the first DAC 23 and transmission device. Furthermore, the transmission device includes the first DRV 24, the optical modulator 25, and the like.

In the transmitting circuit 2B according to the second embodiment, when the reaching to the signal level is detected, the tap coefficient of each of the multipliers 51 is corrected so as to compensate the nonlinear static characteristic of the transmission device in accordance with the reached signal level. Namely, the second FIR filter 50A compensates the signal band at each of the signal levels by the emphasis ratio that is in accordance with the reached signal level. Consequently, regarding the output signal of the transmission device according to the second embodiment, even in a case in which the transmission device exhibits the nonlinear static characteristic, because the nonlinear static characteristic is compensated by using the second FIR filter 50A, the output signal enters the state in which the PAM4 signal levels 0 to 3 can be discriminated on the reception side.

The transmitting circuit 2B1 sets the tap coefficient associated with the emphasis ratio into each of the multipliers 51 included in the second FIR filter 50A so as to compensate the nonlinear static characteristic of the transmission device in accordance with the reached signal level. Consequently, it is possible to apply an optimum emphasis ratio in accordance with a change in the signal level.

Because the transmitting circuit 2B1 can apply an optimum emphasis ratio in accordance with a change in the signal level, it is possible to use nonlinear regions of the transmission device and it is thus possible to balance, for example, an extinction ratio, an improvement of optical modulation amplitude (OMA), and optimization of intersymbol interference.

Furthermore, in the transmitting circuit 2B1 according to the second embodiment described above, a case in which the tap coefficient associated with the signal level that is reached when reaching to the signal level is detected is set into each of the multipliers 51 has been exemplified. However, from among the signal levels 0 to 3, it may also be possible to set, into each of the multipliers 51, the tap coefficient associated with the signal level 0 or 3 at the time of detecting the reaching to an arbitrary signal level, for example, the signal level 0 or 3 in which linearity of the static characteristic of the transmission device is saturated. The embodiment thereof will be described below as a third embodiment.

[c] Third Embodiment

Figure 10:
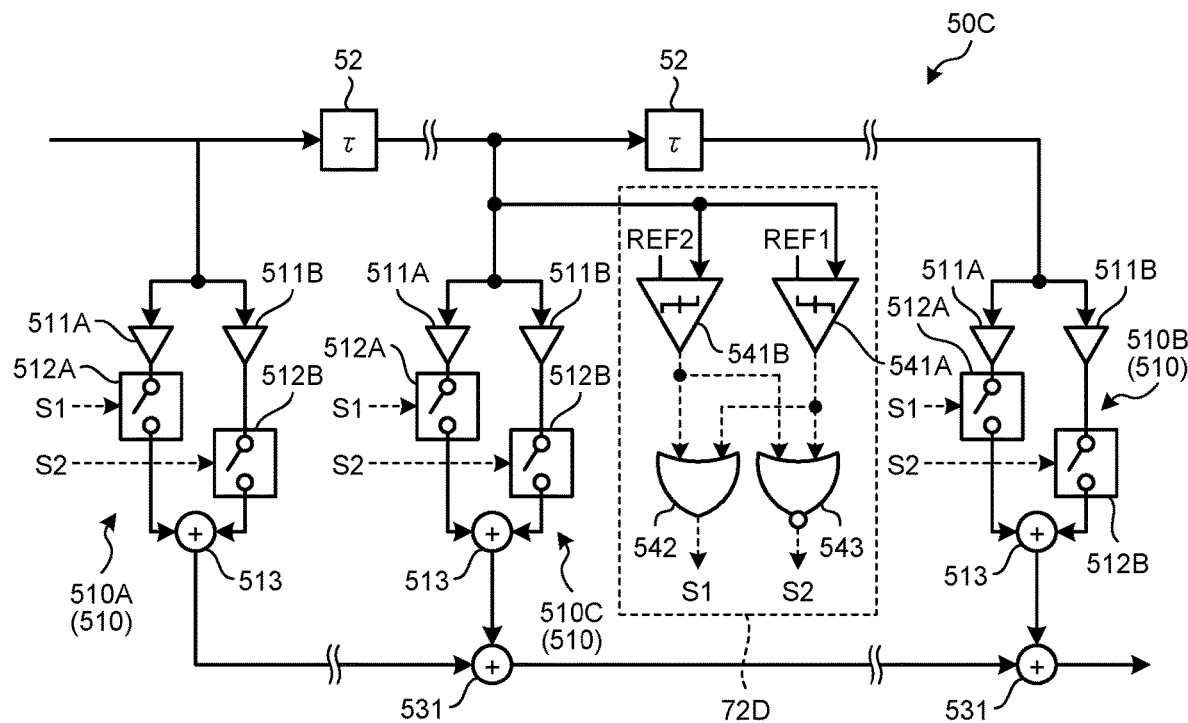
FIG. 10 is a diagram illustrating an example of a third FIR filter according to a third embodiment.

FIG. 10 is a diagram illustrating an example of a third FIR filter 50C according to the third embodiment. Furthermore, by assigning the same reference numerals to components having the same configuration as those in the transmitting circuit 2B1 according to the second embodiment, overlapped descriptions of the configuration and the operation thereof will be omitted. The transmitting circuit 2B1 according to the third embodiment arranges the third FIR filter 50C illustrated in FIG. 10 instead of the first FIR filter 50. Furthermore, the third FIR filter 50C arranges a fourth correcting unit 72D instead of the second correcting unit 72B.

The third FIR filter 50C illustrated in FIG. 10 multiplier sets 510 having X taps, (X−1) pieces of the delay devices 52, and (X−1) pieces of adders 531. Each of the multiplier sets 510 includes a first multiplier 511A for the first tap coefficient, a second multiplier 511B for the second tap coefficient that is different from the first tap coefficient, an output unit 513, a first switch 512A, and a second switch 512B. The first switch 512A turns ON/OFF the connection between the first multiplier 511A and the output unit 513. The second switch 512B turns ON/OFF the connection between the second multiplier 511B and the output unit 513. Regarding the multiplier sets 510 having X taps, a single piece of main multiplier set 510C, M pieces of multiplier sets 510A centered on the main multiplier set 510C, and N pieces of multiplier sets 510B centered on the main multiplier set 510C are arranged in parallel.

The (X−1) pieces of the delay devices 52 are directly connected and delays an input signal by time τ. The outputs of (X−1) pieces of the delay devices 52 are respectively connected to inputs of $M^{th}$ to $N^{th}$ multiplier sets 510 out of the multiplier sets 510 having X taps. The (X−1) pieces of the adders 531 are connected in series. The X pieces of the multiplier sets 510 are combined by (X−1) pieces of the adders 531.

The fourth correcting unit 72D includes a first discriminator 541A, a second discriminator 541B, an OR circuit 542, and a NOR circuit 543. The first discriminator 541A is connected to the input stage of the main multiplier set 510C and determines whether the signal level of a PAM4 electrical signal is greater than or equal to a first threshold REF1. The second discriminator 541B determines whether the signal level of a PAM4 electrical signal is less than or equal to a second threshold REF2.

Figure 11:
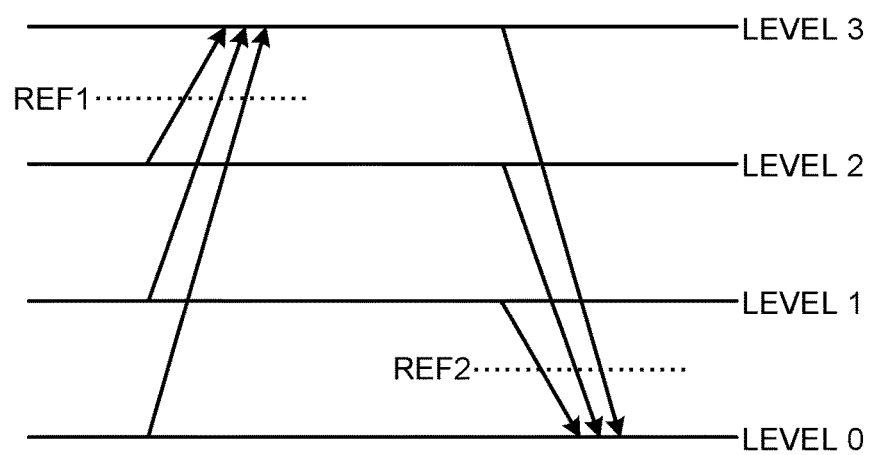
FIG. 11 is a diagram illustrating an example of a first threshold REF1 and a second threshold REF2 according to a third embodiment.

FIG. 11 is a diagram illustrating an example of the first threshold REF1 and the second threshold REF2 according to the third embodiment. When, for example, the signal level reaches the signal level 3 in which the linearity of the static characteristic of the transmission device is saturated, the first discriminator 541A determines that the PAM4 signal level is greater than or equal to the first threshold REF1. When, for example, the signal level reaches the signal level 0 in which the linearity of the static characteristic of the transmission device is saturated, the second discriminator 541B determines that the PAM4 signal level is less than or equal to the second threshold REF2.

When the current signal level is greater than or equal to the first threshold REF1, the first discriminator 541A outputs a high level signal H, whereas, when the current signal level is not greater than or equal to the first threshold REF, the first discriminator 541A outputs a low level signal L. When the current signal level is less than or equal to the second threshold REF2, the second discriminator 541B outputs the high level signal H, whereas, when the current signal level is not less than or equal to the second threshold REF2, the second discriminator 541B outputs a low level signal L.

FIG. 12 is a diagram illustrating a truth value table of the OR circuit 542 and the NOR circuit 543 in the third FIR filter 50C according to the third embodiment. The OR circuit 542 outputs the high level signal H or the low level signal L in accordance with the output result of the first discriminator 541A and the second discriminator 541B. The NOR circuit 543 outputs the high level signal H or the low level signal L in accordance with the first discriminator 541A and the second discriminator 541B.

For example, when the current signal level reaches the signal level 1 or 2, an output of the second discriminator 541B becomes the low level signal L and an output of the first discriminator 541A becomes the low level signal L. Because the output S1 of the OR circuit 542 becomes the low level signal L and the output S2 of the NOR circuit 543 becomes the high level signal H, the first switch 512A is turned OFF and the second switch 512B is turned ON. Consequently, the current signal level reaches the signal level 1 or 2, the third FIR filter 50C uses an output of the second multiplier 511B having the second tap coefficient.

For example, when the current signal level reaches the signal level 3, an output of the second discriminator 541B becomes the low level signal L and an output of the first discriminator 541A becomes the high level signal H. Because the output S1 of the OR circuit 542 becomes the high level signal H and the output S2 of the NOR circuit 543 becomes the low level signal L, the first switch 512A is turned ON and the second switch 512B is turned OFF. Consequently, when the current signal level reaches the signal level 3, the third FIR filter 50C uses an output of the first multiplier 511A having the first tap coefficient.

For example, when the current signal level reaches the signal level 0, an output of the second discriminator 541B becomes the high level signal H and an output of the first discriminator 541A becomes the low level signal L. Because the output S1 of the OR circuit 542 becomes the high level signal H and the output S2 of the NOR circuit 543 becomes the low level signal L, the first switch 512A is turned ON and the second switch 512B is turned OFF. Consequently, when the current signal level reaches the signal level 0, the third FIR filter 50C uses an output of the first multiplier 511A having the first tap coefficient.

For example, when the current signal level reaches the signal level 0 or 3, an output of the second discriminator 541B becomes the high level signal H and an output of the first discriminator 541A becomes the high level signal H. Because the output S1 of the OR circuit 542 becomes the high level signal H and the output S2 of the NOR circuit 543 becomes the low level signal L, the first switch 512A is turned ON and the second switch 512B is turned OFF. Consequently, when the current signal level reaches the signal level 0 or 3, the third FIR filter 50C uses an output of the first multiplier 511A having the first tap coefficient.

When the current signal level reaches the signal level 0 or 3, because the first switch 512A is set to be turned ON and the second switch 512B is set to be turned OFF, the fourth correcting unit 72D uses the first multiplier 511A included in each of the multiplier sets 510. The third FIR filter 50C compensates the signal band of each of the signal levels by the emphasis ratios that are different in accordance with the reached signal levels. Consequently, regarding the output signal of the first EQL 22, because the nonlinear static characteristic is compensated by using the third FIR filter 50C even when the static characteristic of the transmission device is nonlinear, the output signal enters the state in which the PAM4 signal level can be discriminated on the reception side.

Furthermore, regarding the optical communication apparatus 1 according to the first to the third embodiments described above, a case of correcting the tap coefficient of each of the multipliers 51 included in the FIR filter in the transmitting circuit 2B (2B1) in accordance with the signal logic or the signal levels has been exemplified. However, the embodiment is not limited to the transmitting circuit 2B (2B1) and may also be applied to the receiving circuit 3B. Accordingly, the embodiment thereof will described below as a fourth embodiment.

[d] Fourth Embodiment

Figure 13:
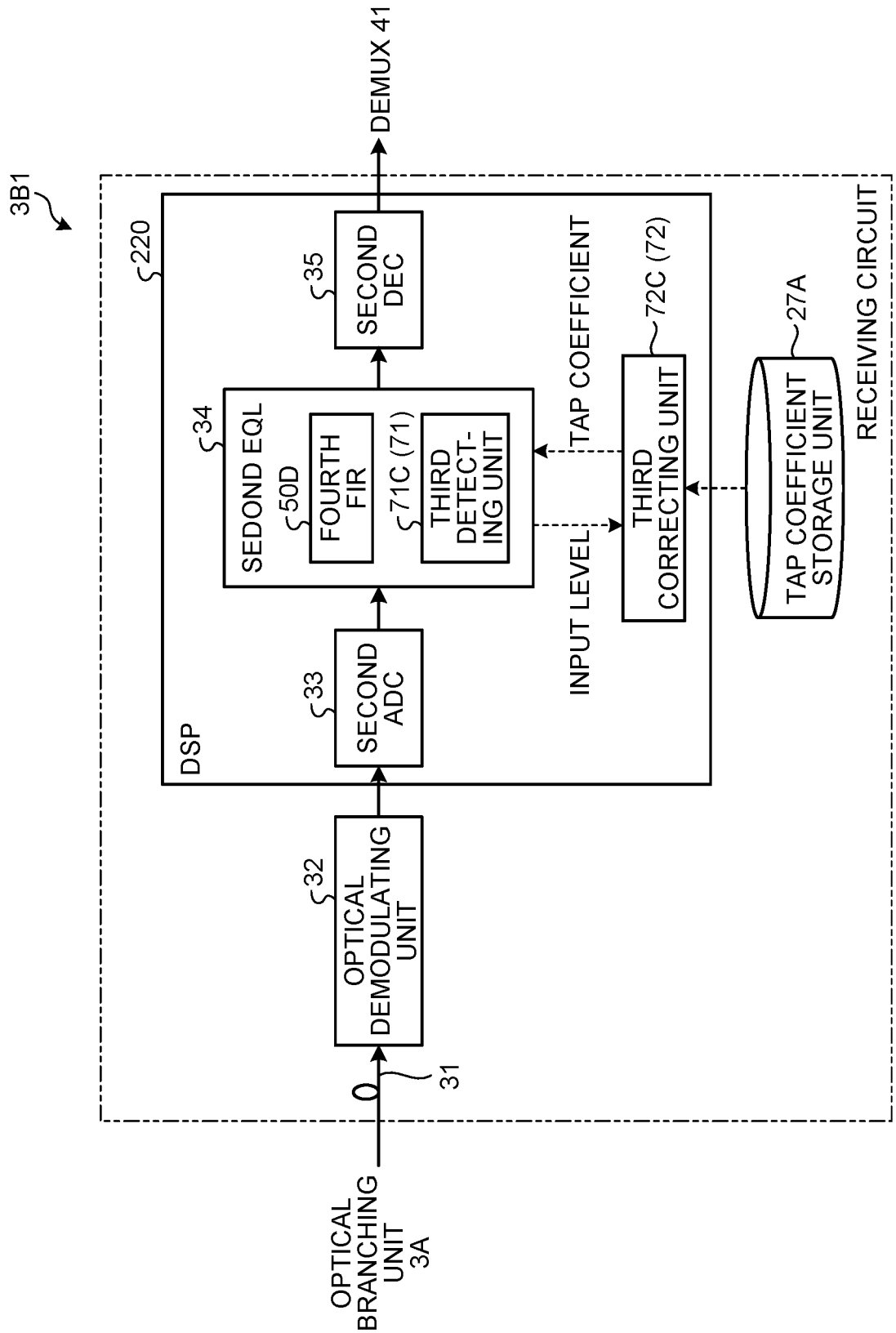
FIG. 13 is a block diagram illustrating an example of a receiving circuit according to a fourth embodiment.

FIG. 13 is a block diagram illustrating an example of a receiving circuit 3B1 according to the fourth embodiment. Furthermore, by assigning the same reference numerals to components having the same configuration as those in the receiving circuit 3B according to the first embodiment, overlapped descriptions of the configuration and the operation thereof will be omitted. The second EQL 34 included in the receiving circuit 3B1 illustrated in FIG. 13 includes a third detecting unit 71C that detects reaching to the signal level 0 or 3 from among the signal levels of the PAM4 electrical signals of the reception signal. The third detecting unit 71C monitors the signal level of the PAM4 electrical signal at the input stage of the main multiplier 51C included in a fourth FIR filter 50D, which will be described later, and detects reaching to the signal level 0 or 3 out of the signal levels from the monitoring result.

The second EQL 34 includes the fourth FIR filter 50D. Furthermore, the configuration of the fourth FIR filter 50D is the same as that of the second FIR filter 50A illustrated in FIG. 9; therefore, by assigning the same reference numerals to components having the same configuration, overlapped descriptions of the configuration and the operation thereof will be omitted. When reaching to the level 0 or 3 out of the signal levels is detected in the third detecting unit 71C, a third correcting unit 72C included in the receiving circuit 3B1 corrects the tap coefficient of each of the multipliers 51 included in the fourth FIR filter 50D in the second EQL 34 in accordance with the signal level 0 or 3.

When reaching to the signal level 0 or 3 out of the signal levels is detected by the third detecting unit 71C, the third correcting unit 72C corrects the tap coefficient of each of the multipliers 51 included in the fourth FIR filter 50D in the second EQL 34 so as to compensate the nonlinear static characteristic of the reception device. Furthermore, the reception device is a connecting part of, for example, the optical demodulating unit 32 and the second ADC 33. Consequently, the output signal of the reception device can compensate the band of the output signal at the signal level 0 or 3.

The receiving circuit 3B1 according to the fourth embodiment corrects, even when the static characteristic of the reception device is nonlinear, the tap coefficient of each of the multipliers 51 included in the fourth FIR filter 50D so as to compensate the nonlinear static characteristic of the reception device in accordance with the signal level 0 or 3 of the reception signal. The fourth FIR filter 50D compensates the signal band at each of the signal levels by the emphasis ratio that is in accordance with the signal level 0 or 3. Consequently, regarding the output signal of the reception device according to the fourth embodiment, even in a case in which the static characteristic of the reception device is nonlinear, because the nonlinear static characteristic is compensated by using the fourth FIR filter 50D, the output signal enters the state in which the PAM4 signal levels 0 to 3 can be discriminated.

Because the receiving circuit 3B1 can apply an optimum emphasis ratio for each signal level of the reception signal, it is possible to use the nonlinear regions of the reception device, and it is thus possible to optimize a reception error rate characteristic including, for example, receiving sensitivity and the maximum reception level.

Furthermore, the fourth FIR filter 50D included in the receiving circuit 3B1 according to the fourth embodiment may also be a compatible type FIR filter, and the embodiment thereof will described below as a fifth embodiment.

[e] Fifth Embodiment

Figure 14:
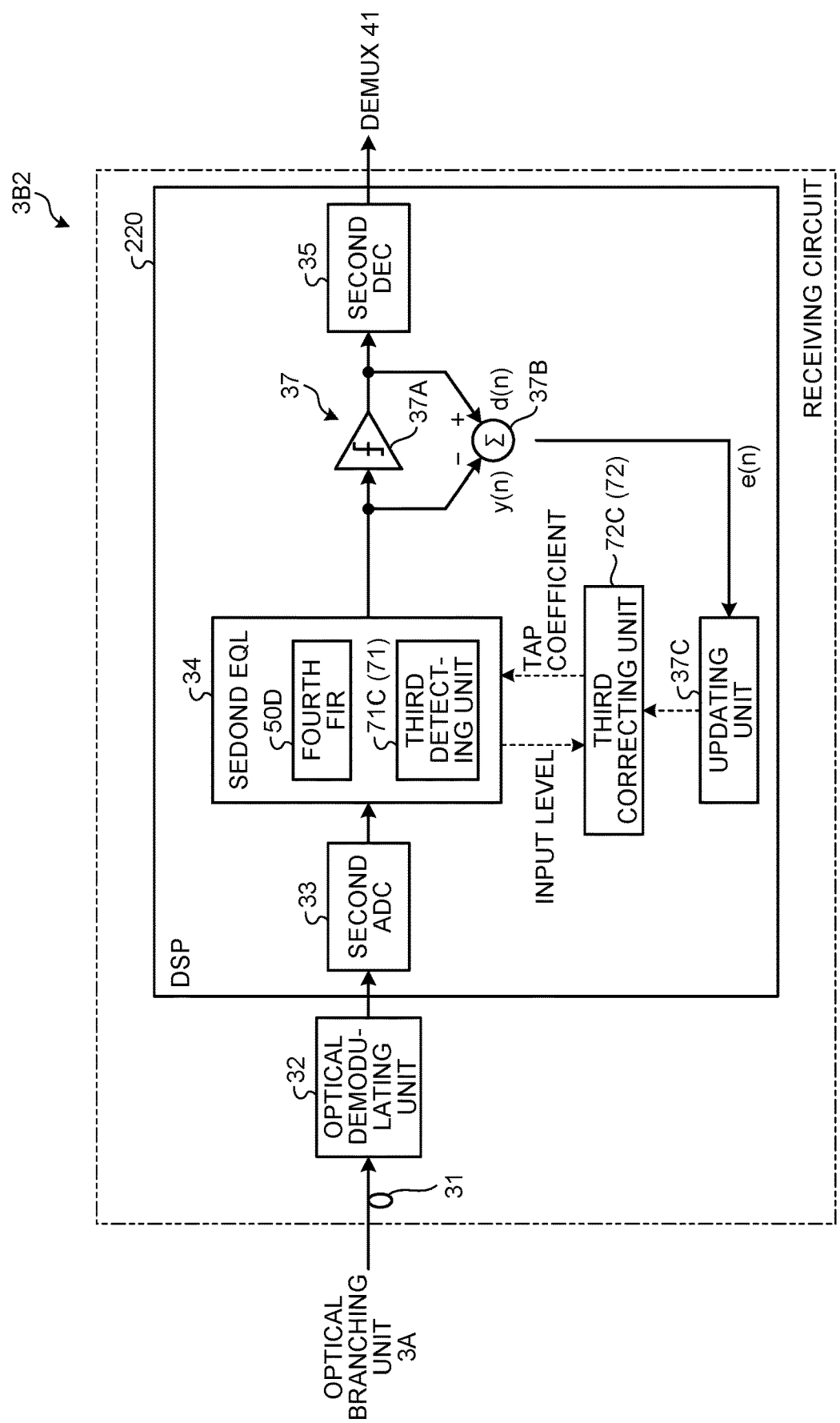
FIG. 14 is a block diagram illustrating an example of a receiving circuit according to a fifth embodiment.

FIG. 14 is a block diagram illustrating an example of a receiving circuit 3B2 according to the fifth embodiment. Furthermore, by assigning the same reference numerals to components having the same configuration as those in the receiving circuit 3B1 according to the fourth embodiment, overlapped descriptions of the configuration and the operation thereof will be omitted. A DSP 220 included in the receiving circuit 3B2 illustrated in FIG. 14 includes, in addition to the second ADC 33, the second EQL 34, and the second DEC 35, a discriminator 37 and the third correcting unit 72C.

Figure 15:
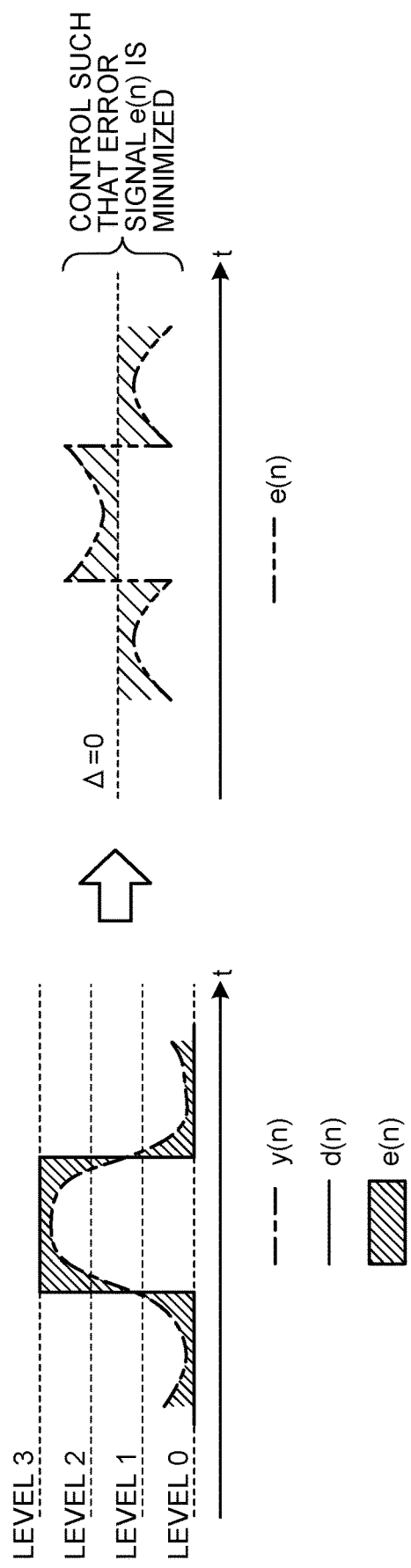
FIG. 15 is a diagram illustrating an example of a discriminating process performed by a discriminator.

FIG. 15 is a diagram illustrating an example of a discriminating process performed by the discriminator 37. The discriminator 37 constructs a compatible type FIR filter by performing the discriminating process of optimizing the tap coefficient included in the fourth FIR filter 50D by using least mean squares (LMS) algorithm or normalized least mean squares (NLMS) algorithm or the like. The discriminator 37 includes a minimizing unit 37A, an arithmetic unit 37B, and an updating unit 37C. The minimizing unit 37A minimizes an error signal of a PAM4 electrical signal that has been subjected to band compensation by the fourth FIR filter 50D. The arithmetic unit 37B calculates an error between the PAM4 electrical signal at an input stage of the minimizing unit 37A and the PAM4 electrical signal at an output stage of the minimizing unit 37A. The updating unit 37C updates the tap coefficient of each of the multipliers 51 in the fourth FIR filter 50D such that the error signal of the arithmetic unit 37B is minimized.

The arithmetic unit 37B calculates, as illustrated in FIG. 15, an error signal e(n) indicating an error between a PAM4 electrical signal y(n) at an input stage and a PAM4 electrical signal d(n) at an output stage. The updating unit 37C updates the tap coefficient of each of the multipliers 51 included in the fourth FIR filter 50D such that the error signal is minimized in the minimizing unit 37A.

Furthermore, when reaching to the signal level 0 or 3 is detected by the third detecting unit 71C, the third correcting unit 72C corrects the tap coefficient of each of the multipliers 51 included in the fourth FIR filter 50D so as to compensate the signal band of the reception signal in accordance with the signal level 0 or 3.

The receiving circuit 3B2 according to the fifth embodiment corrects the tap coefficient of each of the multipliers 51 included in the fourth FIR filter 50D so as to compensate, even when the static characteristic of the reception device is nonlinear, the nonlinear static characteristic of the reception device in accordance with the signal level 0 or 3 of the reception signal. The fourth FIR filter 50D compensates the signal band of the signal level 0 or 3 of the reception signal by the emphasis ratio that is in accordance with the signal level 0 or 3 of the reception signal. Consequently, regarding the output signal of the reception device according to the fifth embodiment, even when the static characteristic of the reception device is nonlinear, because the nonlinear static characteristic is compensated by using the fourth FIR filter 50D, the output signal enters the state in which the PAM4 signal levels 0 to 3 can be discriminated.

Furthermore, in the first to the fifth embodiments, a case in which, when the nonlinear static characteristic of the connecting part is compensated, the tap coefficient of each of the multipliers is corrected in accordance with the signal level is exemplified; however, the embodiments are not limited to compensating the nonlinear static characteristic of the connecting part, there may also be a case in which an emphasis ratio is simply changed in accordance with the signal level. Thus, an embodiment in which a transmitting circuit that uses an electro-absorption modulation laser (EML) 25A instead of the optical modulator 25 will be described below as a sixth embodiment.

[f] Sixth Embodiment

Figure 16:
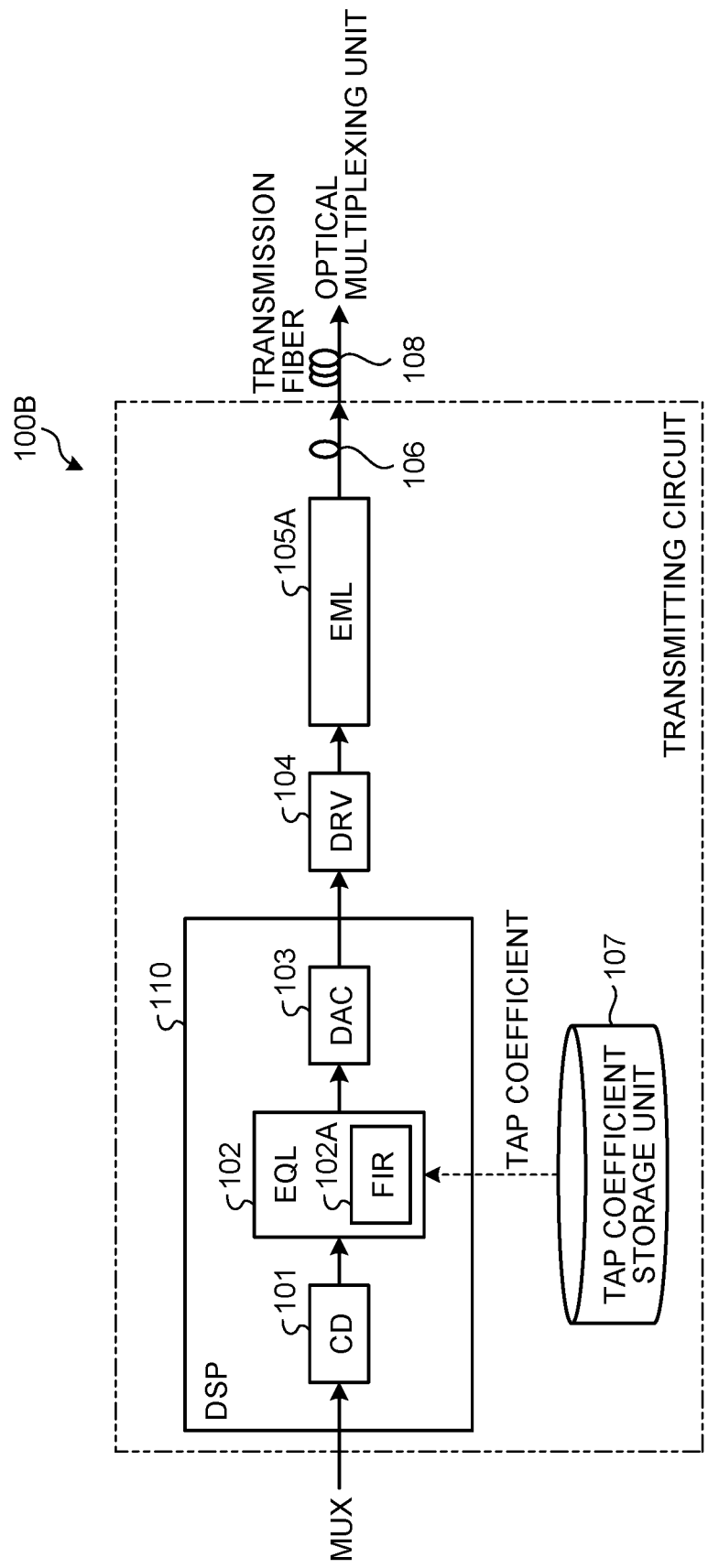
FIG. 16 is a block diagram illustrating an example of a transmitting circuit according to a comparative example 2.

First, a transmitting circuit 100B according to the comparative example 2 that is compared with a transmitting circuit 2B2 according to the sixth embodiment will be described. FIG. 16 is a block diagram illustrating an example of the transmitting circuit 100B according to the comparative example 2. Furthermore, regarding the transmitting circuit 100B according to the comparative example 2, by assigning the same reference numerals to components having the same configuration as those in the transmitting circuit 100 according to the comparative example 1, overlapped descriptions of the configuration and the operation thereof will be omitted. The transmitting circuit 100B illustrated in FIG. 16 includes the DSP 110, the DRV 104, and the optical fiber 106 and arranges an EML 105A instead of the optical modulator 105. The DSP 110 includes the CD 101, the EQL 102, and the DAC 103. The EML 105A includes an LD and an EA modulator that are not illustrated. The EA modulator passes/absorbs an optical signal received from the LD by turning ON/OFF a voltage and modulates a data signal.

Figure 17:
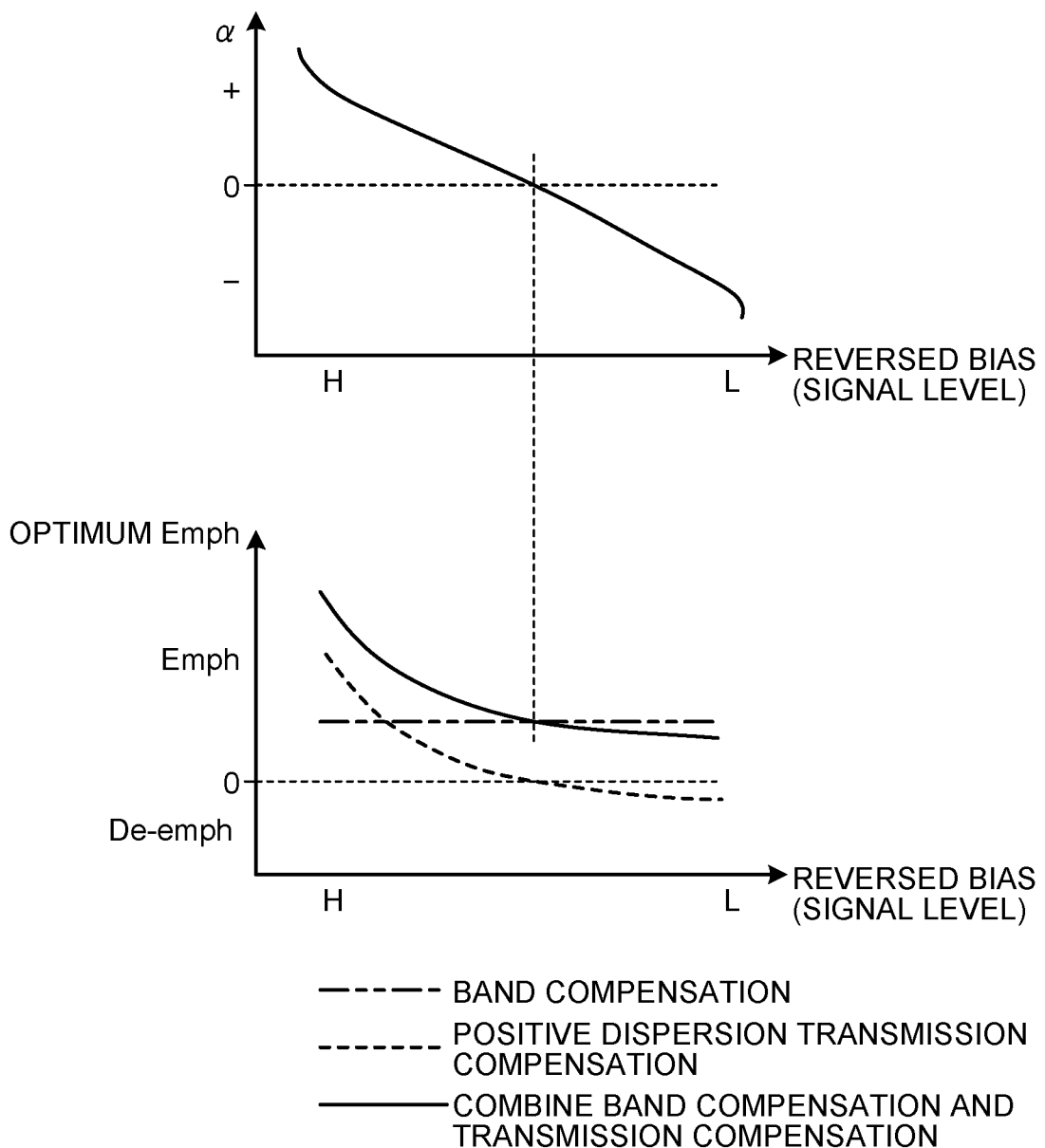
FIG. 17 is a diagram illustrating an example of a relationship between frequency chirp, optimum emphasis, and signal levels according to the comparative example 2.

FIG. 17 is a diagram illustrating an example of a relationship among a frequency chirp, an optimum emphasis ratio, and a signal level of the EML 105A according to the comparative example 2. The optimum emphasis ratio is an optimum emphasis ratio for each of the signal levels of the output signal, of the EML 105A, that has been subjected to positive dispersion in a transmission fiber 108. A frequency chirp characteristic a of the EML 105A varies in the positive direction from a reference value 0 in accordance with a variation in a High direction of the signal level and varies in the negative direction from the reference value 0 in accordance with a variation in a Low direction of the signal level. Furthermore, the variation in the High direction corresponds to a variation in the direction of the signal level 3 and the variation in the Low direction corresponds to a variation in the direction of the signal level 0. Accordingly, the frequency chirp characteristic a varies in the positive direction or the negative direction in accordance with a variation in the signal level. Furthermore, regarding the optimum emphasis ratio of the EML 105A, an emphasis ratio varies in the positive direction in accordance with a variation in the High direction of the signal level and an emphasis ratio varies in the negative direction (de-emphasis direction) in accordance with a variation in the Low direction of the signal level. Accordingly, the optimum emphasis ratio varies in the positive direction or the negative direction, based on zero, in accordance with a variation in the signal level. Namely, the signal level varies in accordance with a variation in the frequency chirp characteristic of the EML 105A and the optimum emphasis ratio also varies in accordance with a variation in the signal level.

Figure 18:
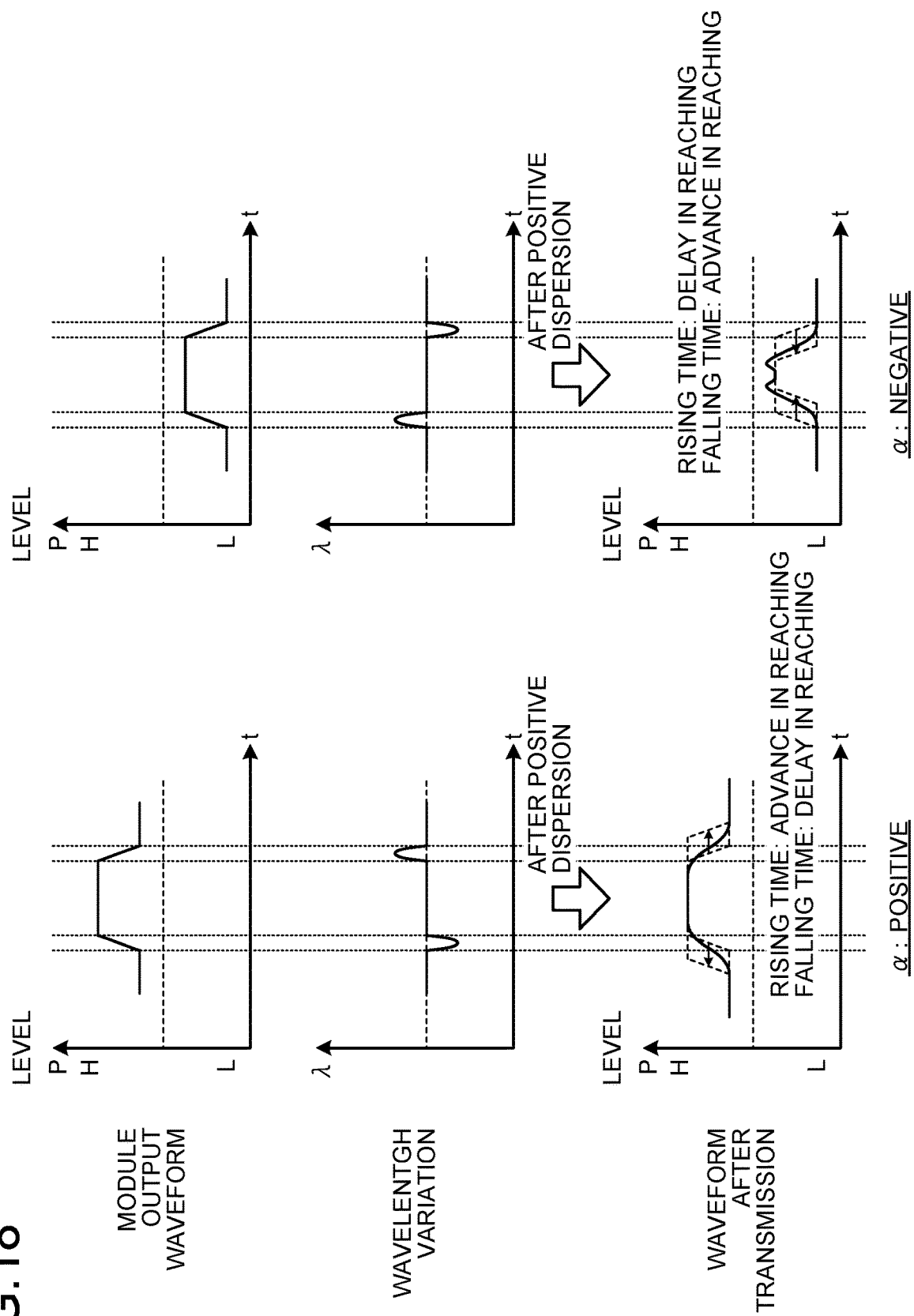
FIG. 18 is a diagram illustrating an example of deterioration of transmission waveform of an EML according to the comparative example 2.

FIG. 18 is a illustrating an example of deterioration of a transmission waveform of the EML 105A according to the comparative example 2. When the frequency chirp characteristic a is positive, the signal level of the output signal at the time of positive dispersion transmission performed by the EML 105A is in the High direction. At this time, if a wavelength variation occurs at the time of rising and falling, regarding an output signal after positive dispersion due to a time lag caused by wavelength variation, an advance in reaching occurs at the time of rising, delay in reaching occurs at the time of falling, and transmission distortion occurs after positive dispersion. At this time, by emphasizing the signal band of the signal level in the High direction, it is possible to dissolve transmission distortion of the output signal after positive dispersion.

Furthermore, when the frequency chirp characteristic a is negative, the signal level of the output signal at the time of positive dispersion transmission performed by the EML 105A is in the Low direction. At this time, if a wavelength variation occurs at the time of rising and falling, regarding an output signal after positive dispersion due to a time lag caused by wavelength variation, delay in reaching occurs at the time of rising, an advance in reaching occurs at the time of falling, and transmission distortion occurs after positive dispersion. At this time, by de-emphasizing the signal band of the signal level in the Low direction, it is possible to dissolve transmission distortion of the output signal after positive dispersion.

However, in the transmitting circuit 100B according to the comparative example 2, because the emphasis ratio is constant regardless of the signal level, it is not possible to vary an optimum emphasis ratio in accordance with the signal level. Thus, the transmitting circuit 2B2 according to a sixth embodiment that can vary an optimum emphasis ratio in accordance with a signal level will be described.

Figure 19:
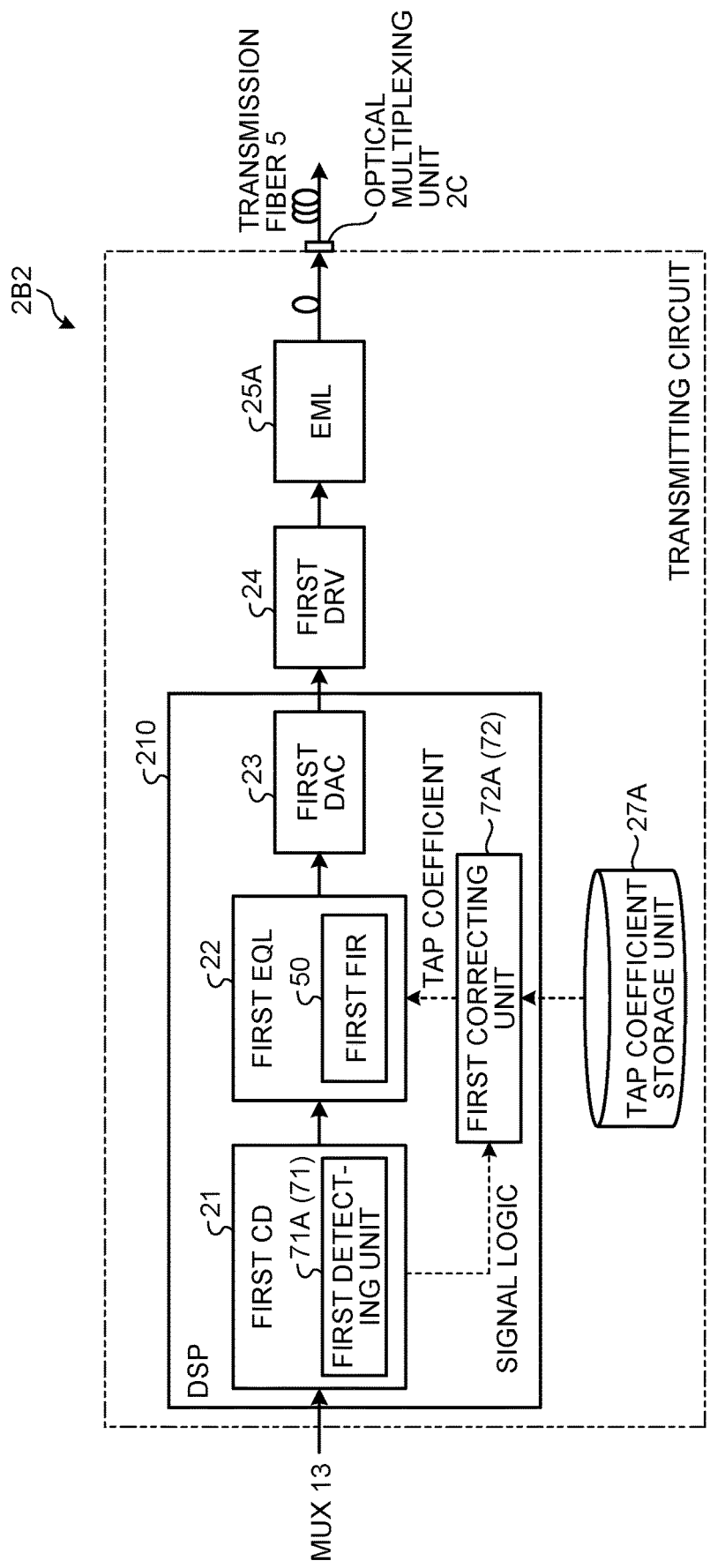
FIG. 19 is a block diagram illustrating an example of a transmitting circuit according to a sixth embodiment.

FIG. 19 is a block diagram illustrating an example of the transmitting circuit 2B2 according to the sixth embodiment. Furthermore, by assigning the same reference numerals to components having the same configuration as those in the transmitting circuit 2B according to the first embodiment, overlapped descriptions of the configuration and the operation thereof will be omitted. The transmitting circuit 2B2 illustrated in FIG. 19 differs from the transmitting circuit 2B according to the first embodiment in that the EML 25A is arranged instead of the optical modulator 25.

The first correcting unit 72A corrects a tap coefficient for each of the multipliers 51 included in the first FIR filter 50 in accordance with the signal logic detected by the first detecting unit 71A and sets the corrected tap coefficient into each of the multipliers 51. The first FIR filter 50 multiplies a PAM4 electrical signal by the corrected tap coefficient and can compensate the signal band of each of the PAM4 signal levels by emphasis ratios that are different at each of the signal levels depending on the sum of the multiplication result of each of the multipliers 51.

Figure 20:
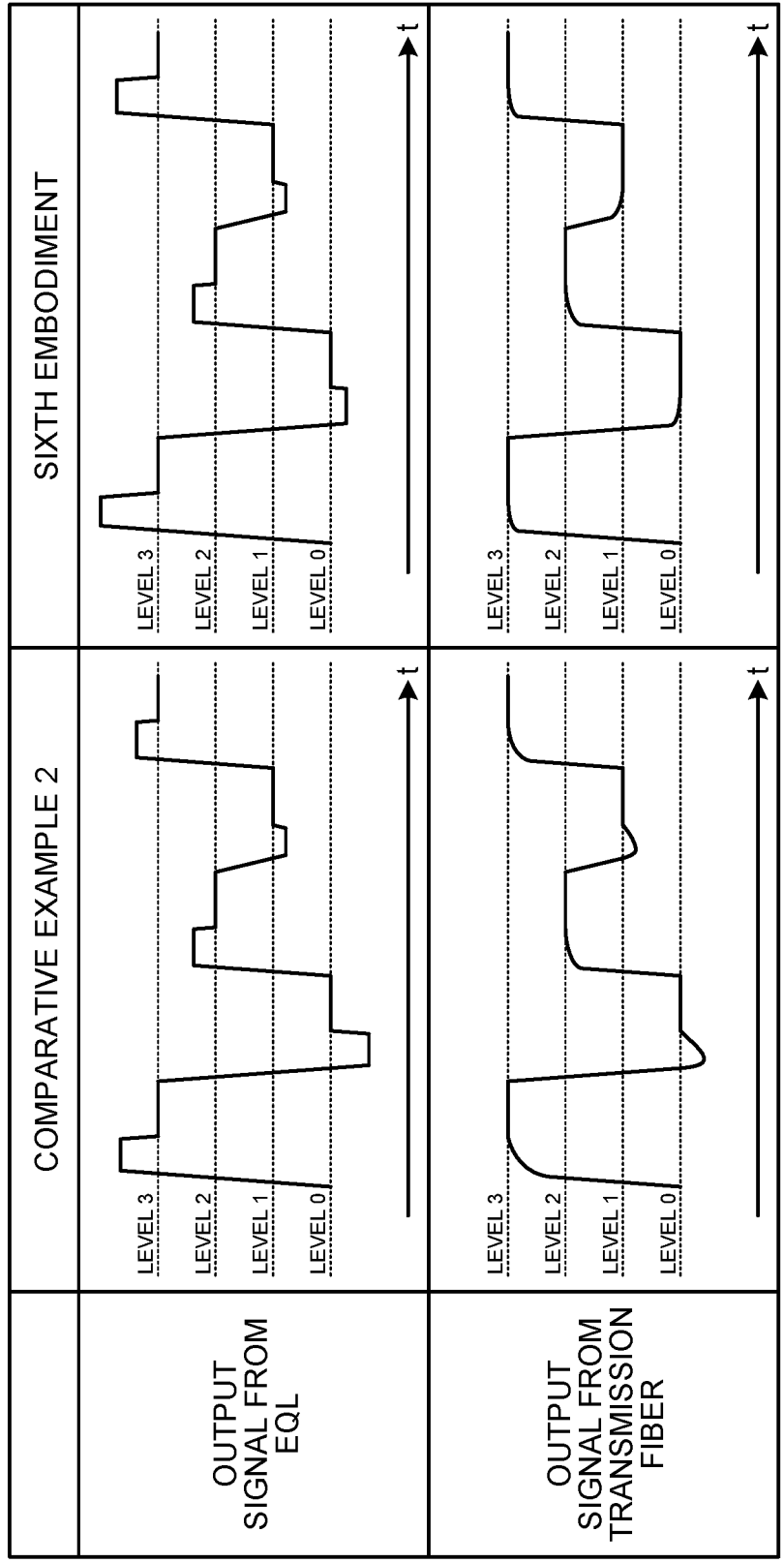
FIG. 20 is a diagram illustrating an example of output signals of transmitting circuits according to the comparative example 2 and the sixth embodiment.

FIG. 20 is a diagram illustrating an example of output signals of transmitting circuits according to the comparative example 2 and the sixth embodiment. The output signal of the EQL 102 in the transmitting circuit 100B according to the comparative example 2 is in a state in which the output at the signal level 0 or 3 is smaller than that at the signal level 1 or 2. In the FIR filter 102A, because the tap coefficient of each of the multipliers is fixed, the emphasis ratios for the corresponding signal levels are the same. Accordingly, regarding the output signal that is being transmitted from the EML 105A through the transmission fiber 108, band compensation of the output signals at, in particular, the signal levels 0 and 3 is insufficient due to transmission distortion that is generated due to a bias voltage-vs-frequency chirp characteristic of the EML 25A.

Consequently, regarding the output signal that is being transmitted from the EML 105A through the transmission fiber 108 according to the comparative example 2, because the signal bands at the signal levels 3 and 0 become small due to transmission distortion of the bias voltage-vs-frequency chirp characteristic, the output signal enters the state in which the PAM4 signal levels 0 or 3 is not discriminated on the reception side.

In contrast, the transmitting circuit 2B2 according to the sixth embodiment corrects the tap coefficient for each of the multipliers 51 included in the first FIR filter 50 so as to compensate the transmission distortion generated due to the bias voltage-vs-frequency chirp characteristic of the EML 25A in accordance with the signal logic. The first FIR filter 50 compensates the signal band of each of the signal levels by the emphasis ratios that are different for each signal level. Consequently, regarding the output signal from the EML 25A through the transmission fiber 5, even when transmission distortion is generated due to the bias voltage-vs-frequency chirp characteristic, because the transmission distortion is compensated by using the first FIR filter 50, the output signal enters the state in which the PAM4 signal levels 0 and 3 can be discriminated on the reception side.

In the transmitting circuit 2B2 according to the sixth embodiment, because the number of taps of each of the multipliers 51 included in the first FIR filter 50 is corrected for each signal level so as to compensate the transmission distortion, it is possible to arbitrarily apply an optimum emphasis ratio for each signal level. Even when the EML 25A having different transmission characteristic for each signal level is used, the transmitting circuit 2B2 can improve the transmission characteristic by compensating the transmission distortion.

Furthermore, in the transmitting circuit 2B2 according to the sixth embodiment described above, a directly modulated laser (DML) 25B may also be used instead of the EML 25A, and the embodiment thereof will described below as a seventh embodiment.

[g] Seventh Embodiment

Figure 21:
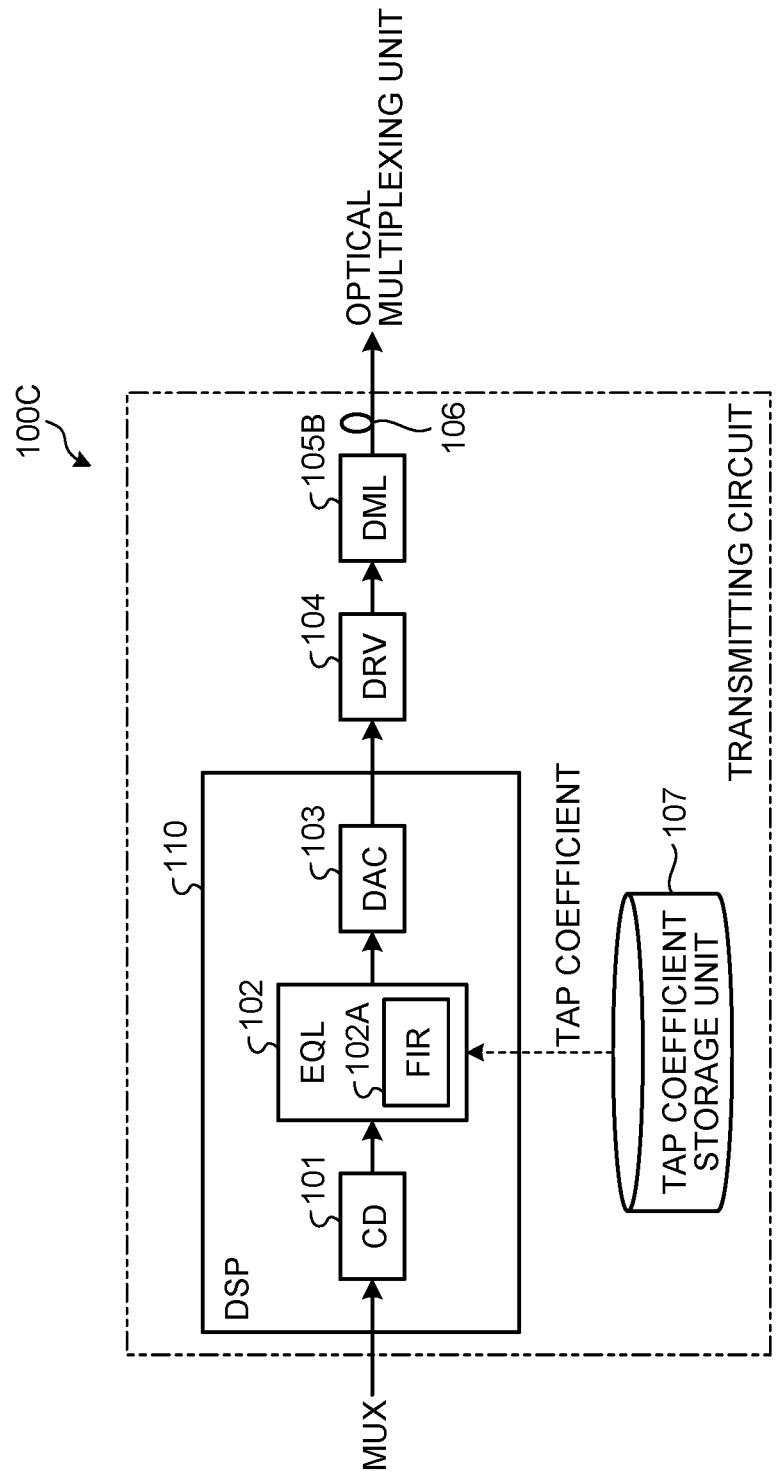
FIG. 21 is a block diagram illustrating an example of a transmitting circuit according to a comparative example 3.

First, a transmitting circuit 100C according to the comparative example 3 that is compared with a transmitting circuit 2B3 according to the seventh embodiment will be described. FIG. 21 is a block diagram illustrating an example of the transmitting circuit 100C according to the comparative example 3. Furthermore, regarding the transmitting circuit 100C according to the comparative example 3, by assigning the same reference numerals to components having the same configuration as those in the transmitting circuit 100 according to the comparative example 1, overlapped descriptions of the configuration and the operation thereof will be omitted. The transmitting circuit 100C illustrated in FIG. 17 includes the DSP 110, the DRV 104, and a DML 105B. The DSP 110 includes the CD 101, the EQL 102, and the DAC 103. The DML 105B modulates an optical output by directly modulating an input current IDL.

Figure 22:
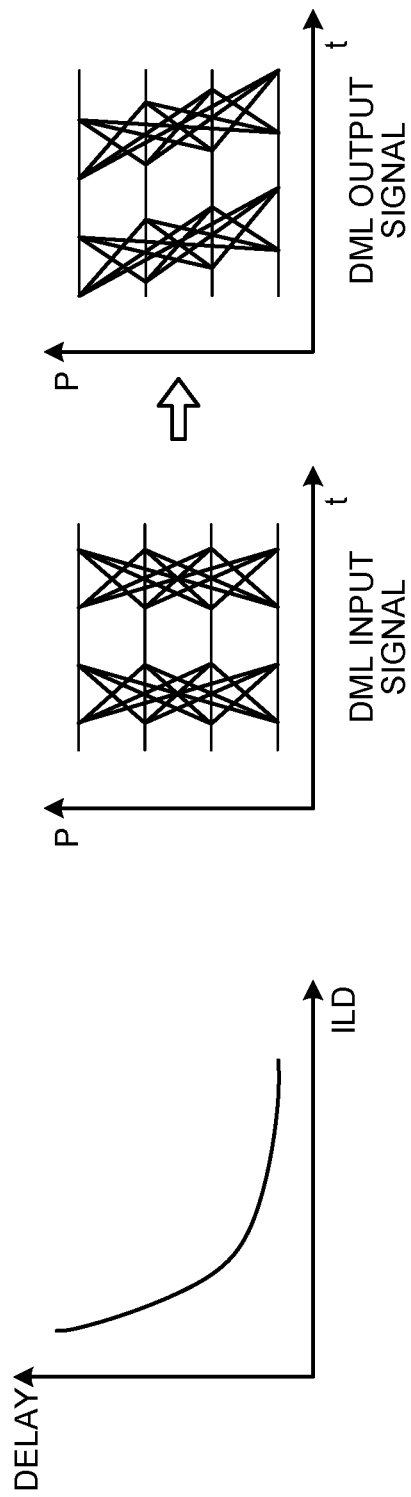
FIG. 22 is a diagram illustrating an example of a DML input signal and a DML output signal according to the comparative example 3.

FIG. 22 is a diagram illustrating an example of DML input signals and DML output signals according to the comparative example 3. The characteristic of the DML 105B illustrated in FIG. 22 has an input current-vs-delay characteristic in which the time constant (delay time) varies in accordance with an amount of input current (ILD) of the input to the DML 105B. Regarding the input to the DML 105B, delay does not occur between signal levels, whereas, regarding an output from the DML 105B, waveform distortion occurs due to delay between the signal levels, for example, skew between levels occurs due to an input current-vs-delay characteristic. Thus, the transmitting circuit 2B3 that compensates skew between levels will be described as the seventh embodiment.

Figure 23:
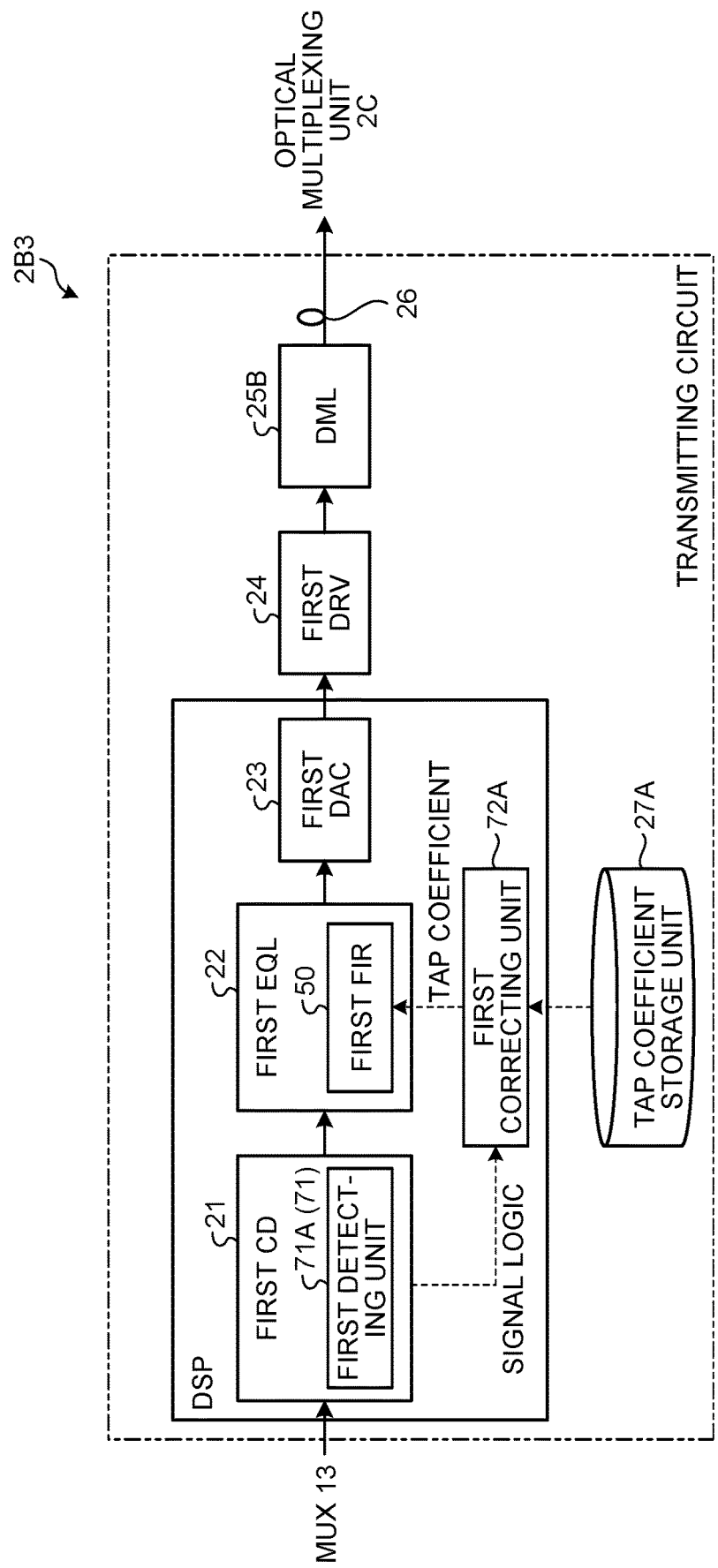
FIG. 23 is a block diagram illustrating an example of a transmitting circuit according to a seventh embodiment.

FIG. 23 is a block diagram illustrating an example of the transmitting circuit 2B3 according to the seventh embodiment. Furthermore, by assigning the same reference numerals to components having the same configuration as those in the transmitting circuit 2B according to the first embodiment, overlapped descriptions of the configuration and the operation thereof will be omitted. The transmitting circuit 2B3 illustrated in FIG. 23 arranges the DML 25B instead of the optical modulator 25.

The first correcting unit 72A corrects the tap coefficient of each of the multipliers 51 included in the first FIR filter 50 so as to compensate the skew between signal levels in accordance with the signal logic detected in the first detecting unit 71A and sets the corrected tap coefficient into each of the multipliers 51. The first FIR filter 50 multiplies a PAM4 electrical signal by the corrected tap coefficient and can compensate the PAM4 signal band by emphasis ratios that are different for each signal level depending on the sum of the multiplication result of each of the multipliers 51.

Figure 24:
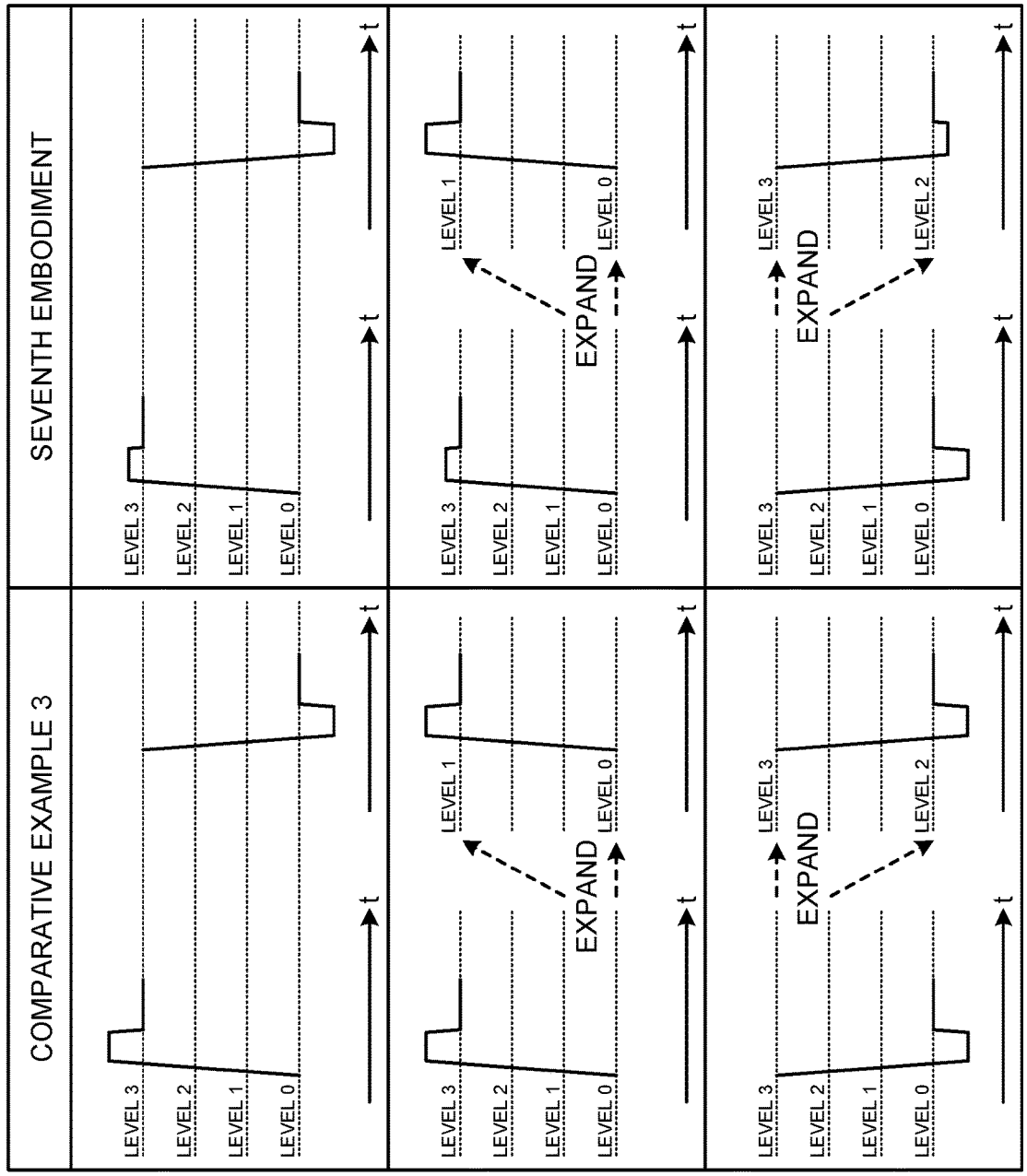
FIG. 24 is a diagram illustrating an example of compensation performed on an output signal of an EQL according to the comparative example 3 and an output signal of a first EQL according to the seventh embodiment.
Figure 27:
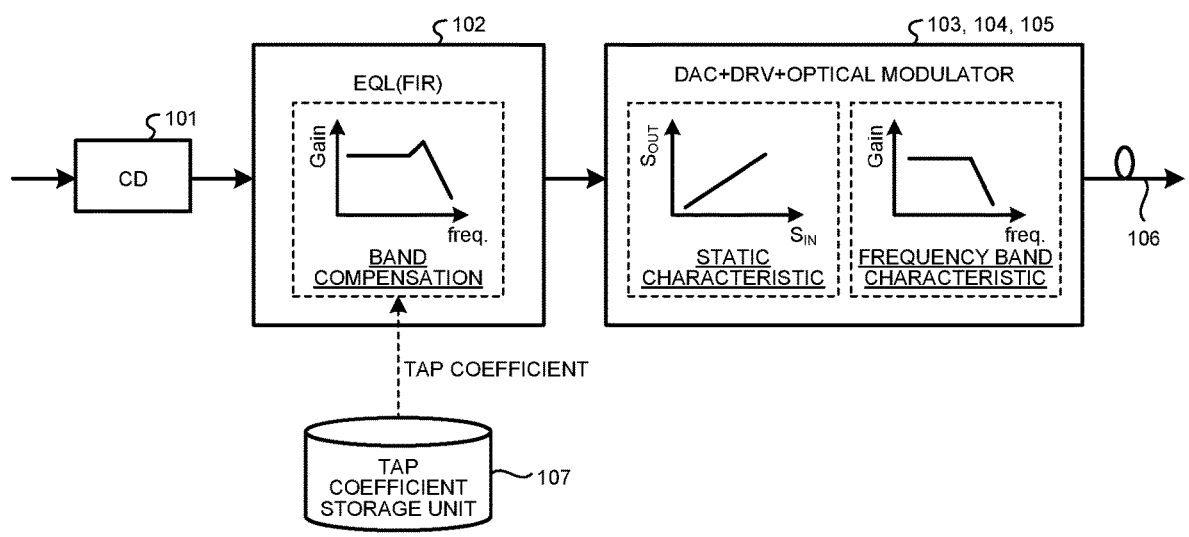
FIG. 27 is a diagram illustrating an example of an output characteristic for each unit included in the transmitting circuit.
Figure 28:
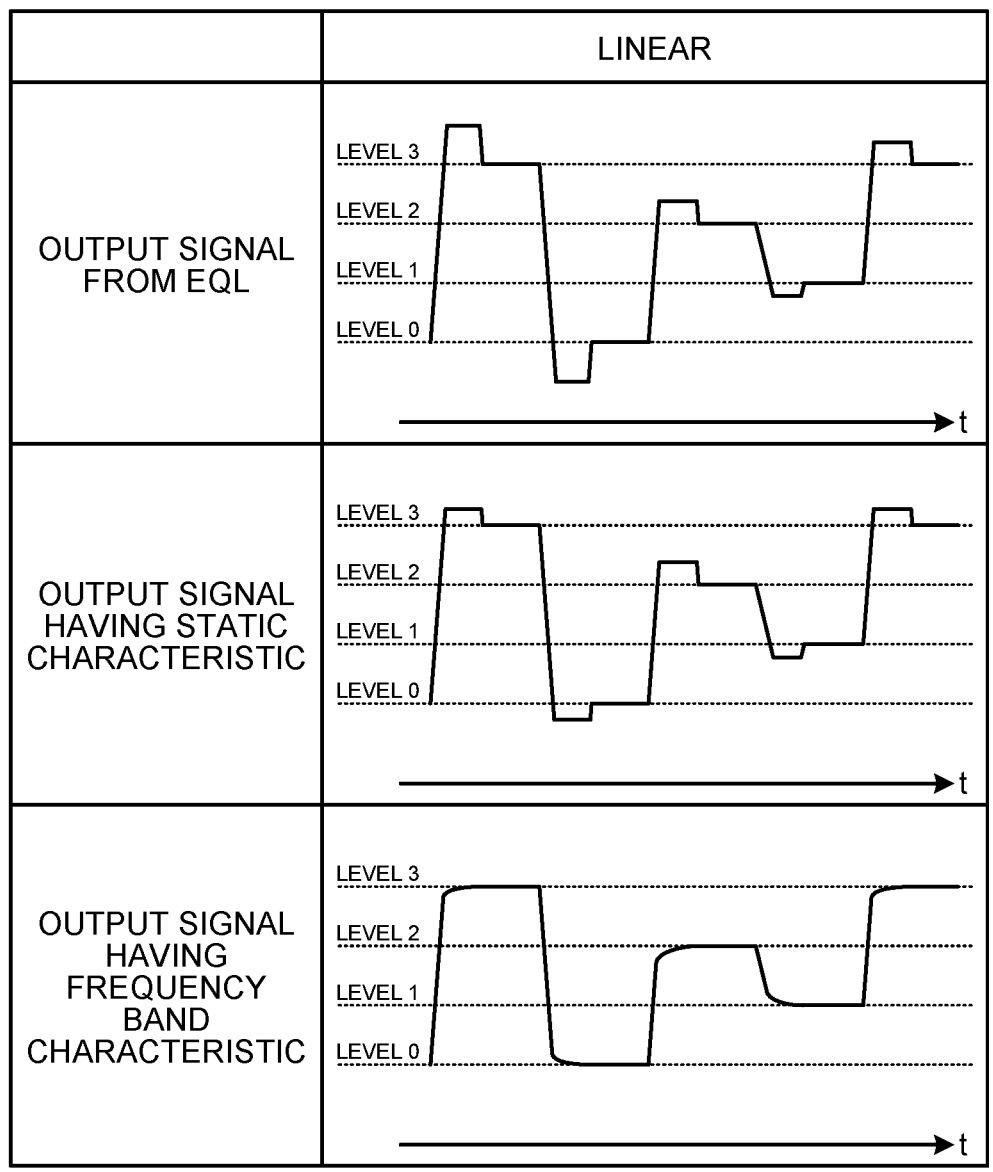
FIG. 28 is a diagram illustrating an example of an output signal for each unit in a case in which the static characteristic of the transmission device included in the transmitting circuit is linear.
Figure 29:
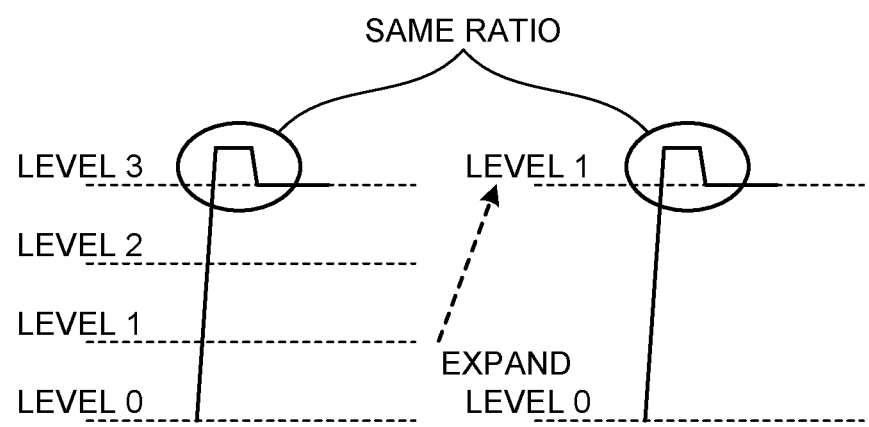
FIG. 29 is a diagram illustrating an example in which emphasis ratios for each of the signal levels are the same ratio.
Figure 30:
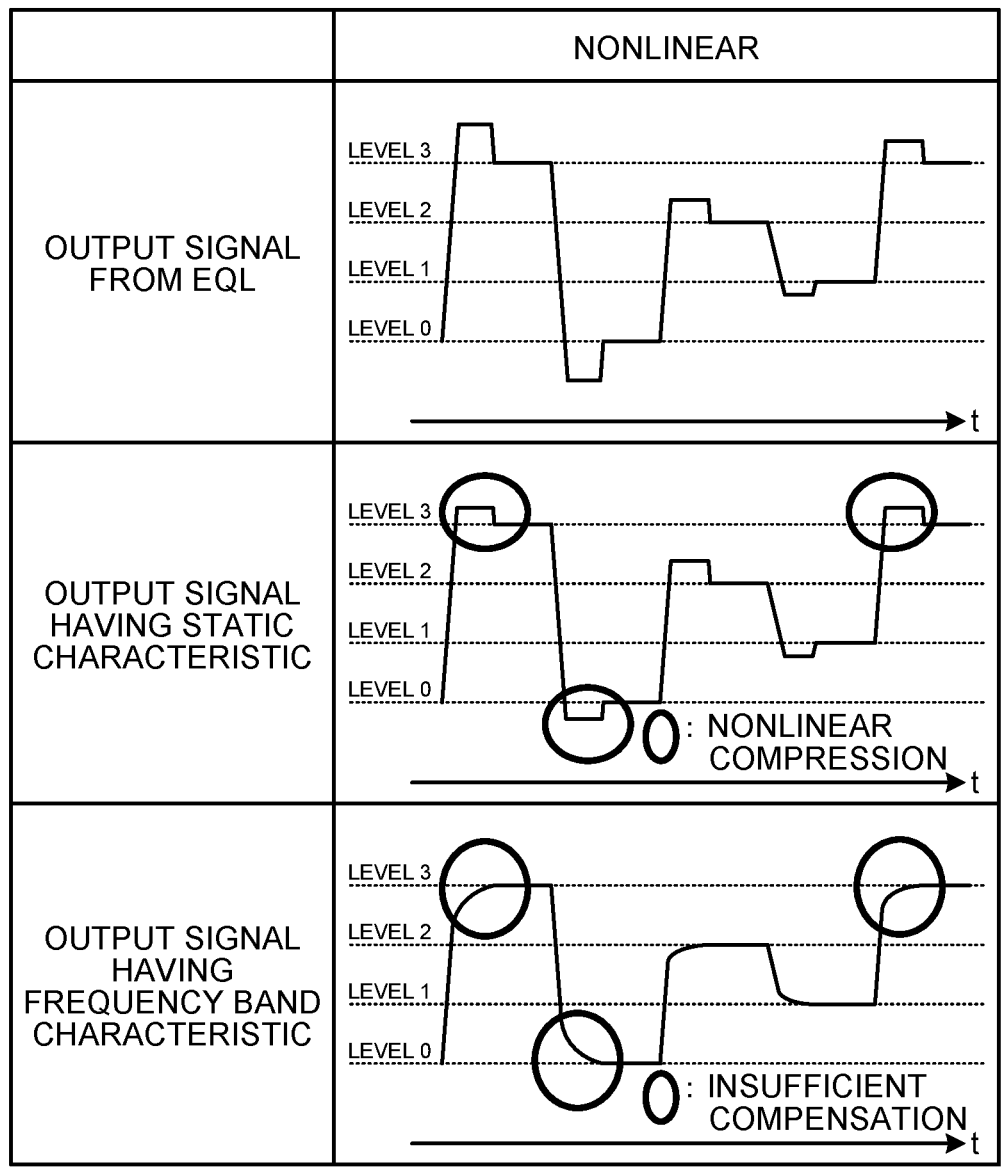
FIG. 30 is a diagram illustrating an example of an output signal for each unit in a case in which the static characteristic of each of the transmission devices included in the transmitting circuit is nonlinear.

FIG. 24 is a diagram illustrating an example of compensation between the output signal of the EQL 102 according to the comparative example 3 and the output signal of the first EQL 22 according to the seventh embodiment. Regarding the output signal of the EQL 102 according to the comparative example 3, emphasis ratios of rising and falling are the same. In contrast, regarding the output signal of the first EQL 22 according to the seventh embodiment, compensation is performed such that the emphasis ratio of falling is increased as compared with the emphasis ratio of rising and the emphasis ratio of the signal level for a small amount of input current of the DML 25B is increased with respect to the signal level for a large amount of input current.

Furthermore, regarding an output signal of the DML 105B according to the comparative example 3, for example, the emphasis ratios of the rising signal level 3 and the rising signal level 0 are the same. In contrast, regarding an output signal of the DML 25B according to the seventh embodiment, when an output of the rising signal level 3 is weak, compensation is performed so as to increase the emphasis ratio of the rising signal level 1.

Furthermore, regarding an output signal of the DML 105B according to the comparative example 3, for example, the emphasis ratio of the falling signal level 0 and that of the falling signal level 2 are the same. In contrast, regarding an output signal of the DML 25B according to the seventh embodiment, when an output of the falling signal level 0 is strong, compensation is performed such that the emphasis ratio of the falling signal level 2 is weakened.

FIG. 25 is a diagram illustrating an example of DML input signals and DML output signals according to the comparative example 3 and the seventh embodiment. Regarding an output signal of the DML 105B according to the comparative example 3, skew is generated between levels due to delay between the signal levels. In contrast, an input signal of the DML 25B according to the seventh embodiment is in a state in which the signal band is compensated, performed by using the first FIR filter 50, such that the signal level on the High side is slow and the signal level on the Low side is fast. Furthermore, regarding an output signal of the DML 25B, because an input signal having the compensated band is input to the DML 25B, there is no delay of the input signal of the DML 25B at all of the signal levels, i.e., in a state in which skew between levels has been compensated.

In the transmitting circuit 2B3 according to the seventh embodiment, because the tap coefficient of each of the multipliers 51 in the first FIR filter 50 is corrected for each signal level, it is possible to arbitrarily apply an optimum emphasis ratio for each signal level and it is thus possible to correct skew generated between levels depending on an electric current with an amount of delay of DML modulation.

The optical communication apparatus 1 according to the first to the seventh embodiments includes the detecting unit 71, the first FIR filter 50, and the correcting unit 72. The detecting unit 71 detects level information that discriminates a change in the multi-value level from an input signal used in the multi-value amplitude modulation system (PAM4). The first FIR filter 50 compensates the signal band of the input signal in accordance with the tap coefficients of the plurality of the multipliers 51. The correcting unit 72 corrects, based on the level information detected in the detecting unit 71, the tap coefficient of each of the multipliers 51 included in the first FIR filter 50. Consequently, by changing the tap coefficients of the multipliers in accordance with the signal levels, it is possible to optimize the emphasis ratio of the signals.

Furthermore, for convenience of description, PAM4 is exemplified as a signal used in the multi-value amplitude modulation system, the signal is not limited to PAM4 and may also be, of course, used for, for example, PAM 6, PAM 8, and the like.

Regarding the receiving circuit 3B1 according to the fourth embodiment and the receiving circuit 3B2 according to the fifth embodiment, a case in which, when reaching to a signal level is detected, the tap coefficient of each of the multipliers 51 included in the fourth FIR filter 50D is corrected in accordance with the signal level has been exemplified. However, the embodiment is not limited to a case of detecting the reaching to the signal level. The tap coefficient of each of the multipliers 51 included in the fourth FIR filter 50D may also be corrected in accordance with the signal logic, and, furthermore, modifications are possible as needed.

The detecting unit 71 as the level detector is, for example, the first detecting unit 71A, the second detecting unit 71B, or the third detecting unit 71C that detects level information that discriminates a change in the multi-value level based on an input signal in the multi-value amplitude modulation system. The FIR filter 50 is, for example, the first FIR filter 50, the second FIR filter 50A, the third FIR filter 50C, the fourth FIR filter, or the like that compensates the signal band of the input signal in accordance with the tap coefficients of the plurality of the multipliers 51. The correcting unit 72 as an adjustor is, for example, the first correcting unit 72A, the second correcting unit 72B, the third correcting unit 72C, or the fourth correcting unit 72D that corrects the tap coefficient of each of the multipliers 51 included in the first FIR filter 50 based on the level information (the signal level or the signal logic) detected by the detecting unit 71.

Each of the components in the units illustrated in the drawings is not always physically configured as illustrated in the drawings. In other words, the specific shape of a separate or integrated unit is not limited to the drawings; however, all or part of the unit can be configured by functionally or physically separating or integrating any of the units depending on various kinds of loads or use conditions.

Furthermore, all or any part of various processing functions performed by each unit may also be executed by a central processing unit (CPU) (or a microcomputer, such as a micro processing unit (MPU), a micro controller unit (MCU), or the like). Furthermore, all or any part of various processing functions may also be, of course, executed by programs analyzed and executed by the CPU (or the microcomputer, such as the MPU or the MCU), or executed by hardware by wired logic.

According to an aspect of an embodiment, it is possible to optimize an emphasis ratio of signals by changing tap coefficients of multipliers in accordance with a change in the signal level.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical communication apparatus comprising:
   a level detector that detects level information that discriminates a change in a multi-value level based on an input signal used in a multi-value amplitude modulation system;
   an FIR filter that compensates a signal band of the input signal in accordance with tap coefficients of a plurality of multipliers;
   a digital to analog converter that performs analog conversion on an output signal of the FIR filter;
   a driver that outputs a driving signal in accordance with the output signal that has been subjected to analog conversion;
   an optical modulator that performs optical conversion on the output signal in accordance with the driving signal of the driver; and
   an adjustor that corrects, based on the level information detected in the level detector, the tap coefficient of each of the multipliers included in the FIR filter so as to compensate nonlinear static characteristics of the digital to analog converter, the driver, and the optical modulator.

2. The optical communication apparatus according to claim 1, wherein
   the optical modulator is an electro-absorption modulation laser (EML), and
   the adjustor corrects the tap coefficient of each of the multipliers included in the FIR filter so as to compensate transmission distortion generated due to a bias voltage-vs-chirp characteristic of the EML.

3. The optical communication apparatus according to claim 1, wherein
   the optical modulator is a directly modulated laser (DML), and
   the adjustor corrects the tap coefficient of each of the multipliers included in the FIR filter so as to compensate skew between levels generated due to an input current-vs-delay characteristic of the DML.

4. The optical communication apparatus according to claim 1, wherein the level detector detects the level information that discriminates a signal logic indicating a change transition of the multi-value level of the input signal.

5. The optical communication apparatus according to claim 1, wherein the level detector detects the level information that discriminates a level reached due to the change in the multi-value level of the input signal.

6. The optical communication apparatus according to claim 1, further comprising:
   a photodetector that performs photoelectric conversion on the input signal used in the multi-value amplitude modulation system; and
   an analog to digital converter that performs digital conversion on an input signal that has been subjected to photoelectric conversion by the photodetector, wherein
   the adjustor corrects the tap coefficient of each of the multipliers included in the FIR filter that compensates the signal band of the input signal that has been subjected to digital conversion and that is received from the analog to digital converter so as to compensate nonlinear static characteristics of the photodetector and the analog to digital converter.

7. A correcting method performed by an optical communication apparatus, the correcting method comprising:
   detecting level information that discriminates a change in a multi-value level based on an input signal used in a multi-value amplitude modulation system;
   compensating a signal band of the input signal in accordance with tap coefficients of a plurality of multipliers included in an FIR filter;
   performing analog conversion on an output signal of the FIR filter;
   outputting a driving signal in accordance with the output signal that has been subjected to analog conversion;
   performing optical conversion on the output signal in accordance with the driving signal of the outputting; and
   correcting the tap coefficient of each of the multipliers included in the FIR filter based on the detected level information so as to compensate nonlinear static characteristics of the performing analog conversion, the outputting, and the performing optical conversion.

8. An optical communication apparatus comprising:
   a level detector that detects level information that discriminates a change in PAM-N symbol levels based on an input signal used in a N-level pulse amplitude modulation system, where N is any integer that is the nth power of 2;
   an FIR filter that compensates a signal band of the input signal in accordance with tap coefficients of a plurality of multipliers;
   a digital to analog converter that performs analog conversion on an output signal of the FIR filter;
   a driver that outputs a driving signal in accordance with the output signal that has been subjected to analog conversion;
   an optical modulator that performs optical conversion on the output signal in accordance with the driving signal of the driver; and
   an adjustor that corrects, based on the level information detected in the level detector, the tap coefficient of each of the multipliers included in the FIR filter so as to compensate nonlinear static characteristics of the digital to analog converter, the driver, and the optical modulator.

9. A correcting method performed by an optical communication apparatus, the correcting method comprising:
   detecting level information that discriminates a change in PAM-N symbol levels based on an input signal used in a N-level pulse amplitude modulation system, where N is any integer that is the nth power of 2;

compensating a signal band of the input signal in accordance with tap coefficients of a plurality of multipliers included in an FIR filter;
performing analog conversion on an output signal of the FIR filter;
outputting a driving signal in accordance with the output signal that has been subjected to analog conversion;
performing optical conversion on the output signal in accordance with the driving signal of the outputting; and
correcting the tap coefficient of each of the multipliers included in the FIR filter based on the detected level information so as to compensate nonlinear static characteristics of the performing analog conversion, the outputting, and the performing optical conversion.

* * * * *